US011195857B2

(12) United States Patent
Kai et al.

(10) Patent No.: US 11,195,857 B2
(45) Date of Patent: *Dec. 7, 2021

(54) BONDED THREE-DIMENSIONAL MEMORY DEVICES AND METHODS OF MAKING THE SAME BY REPLACING CARRIER SUBSTRATE WITH SOURCE LAYER

(71) Applicant: SANDISK TECHNOLOGIES LLC, Addison, TX (US)

(72) Inventors: James Kai, Santa Clara, CA (US); Ching-Huang Lu, Fremont, CA (US); Murshed Chowdhury, Fremont, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/816,691

(22) Filed: Mar. 12, 2020

(65) Prior Publication Data

US 2020/0258904 A1 Aug. 13, 2020

Related U.S. Application Data

(63) Continuation of application No. 16/274,687, filed on Feb. 13, 2019, now Pat. No. 10,629,616.

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 27/1157* (2013.01); *H01L 27/11519* (2013.01);
(Continued)

(58) Field of Classification Search
CPC ......... H01L 27/11582; H01L 27/11565; H01L 27/1157; H01L 27/11519; H01L 27/11573;
(Continued)

(56) References Cited

U.S. PATENT DOCUMENTS 5,915,167 A  6/1999 Leedy
9,530,790 B1 * 12/2016 Lu .................... H01L 27/11575
(Continued)

FOREIGN PATENT DOCUMENTS

KR  10-2019-0026418 A   3/2019
KR  10-2019-0118751 A  10/2019
WO  WO2019-143400 A1   7/2019

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Karen Kusumakar
(74) *Attorney, Agent, or Firm* — The Marbury Law Group PLLC

(57) ABSTRACT

A three-dimensional memory device may include an alternating stack of insulating layers and spacer material layers formed over a carrier substrate. The spacer material layers are formed as, or are subsequently replaced with, electrically conductive layers. Memory stack structures are formed through the alternating stack. Each memory stack structure includes a respective vertical semiconductor channel and a respective memory film. Drain regions and bit lines can be formed over the memory stack structures to provide a memory die. The memory die can be bonded to a logic die containing peripheral circuitry for supporting operations of memory cells within the memory die. A distal end of each of the vertical semiconductor channels is physically exposed
(Continued)

by removing the carrier substrate. A source layer is formed directly on the distal end each of the vertical semiconductor channels. A bonding pad can be formed on the source layer.

20 Claims, 31 Drawing Sheets

(51) Int. Cl.
*H01L 27/1157* (2017.01)
*H01L 27/11573* (2017.01)
*H01L 27/11529* (2017.01)
*H01L 27/11556* (2017.01)
*H01L 27/11558* (2017.01)
*H01L 27/11524* (2017.01)
*H01L 27/11519* (2017.01)

(52) U.S. Cl.
CPC .. *H01L 27/11524* (2013.01); *H01L 27/11529* (2013.01); *H01L 27/11556* (2013.01); *H01L 27/11558* (2013.01); *H01L 27/11565* (2013.01); *H01L 27/11573* (2013.01)

(58) Field of Classification Search
CPC ......... H01L 27/11558; H01L 27/11529; H01L 27/11556; H01L 27/11524
See application file for complete search history.

(56) References Cited

U.S. PATENT DOCUMENTS

| | | |
|---|---|---|
| 9,935,050 B2 | 4/2018 | Dunga et al. |
| 10,354,980 B1 | 7/2019 | Mushiga et al. |
| 2014/0061750 A1 | 3/2014 | Kwon et al. |
| 2016/0079164 A1 | 3/2016 | Fukuzumi et al. |
| 2017/0040338 A1 | 2/2017 | Lee et al. |
| 2017/0294377 A1 | 10/2017 | Dunga et al. |
| 2018/0261613 A1 | 9/2018 | Ariyoshi |
| 2018/0350879 A1 | 12/2018 | Sel et al. |
| 2019/0280002 A1 | 9/2019 | Kai et al. |

OTHER PUBLICATIONS

U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/213,180, filed Dec. 7, 2018, SanDisk Technologies LLC.
U.S. Appl. No. 16/213,382, filed Dec. 7, 2018, SanDisk Technologies LLC.
U.S. Appl. No. 16/231,752, filed Dec. 24, 2018, SanDisk Technologies LLC.
U.S. Appl. No. 16/248,923, filed Jan. 16, 2019, SanDisk Technologies LLC.
Notification of Transmittal of the International Search Report and Written Opinion of the International Search Authority for International Patent Application No. PCT/US2019/062739, dated Apr. 16, 2020, 10 pages.
Notification of Transmittal of the International Search Report and Written Opinion of the International Search Authority for International Patent Application No. PCT/US2020/039105, dated Dec. 18, 2020, 11 pages.

\* cited by examiner

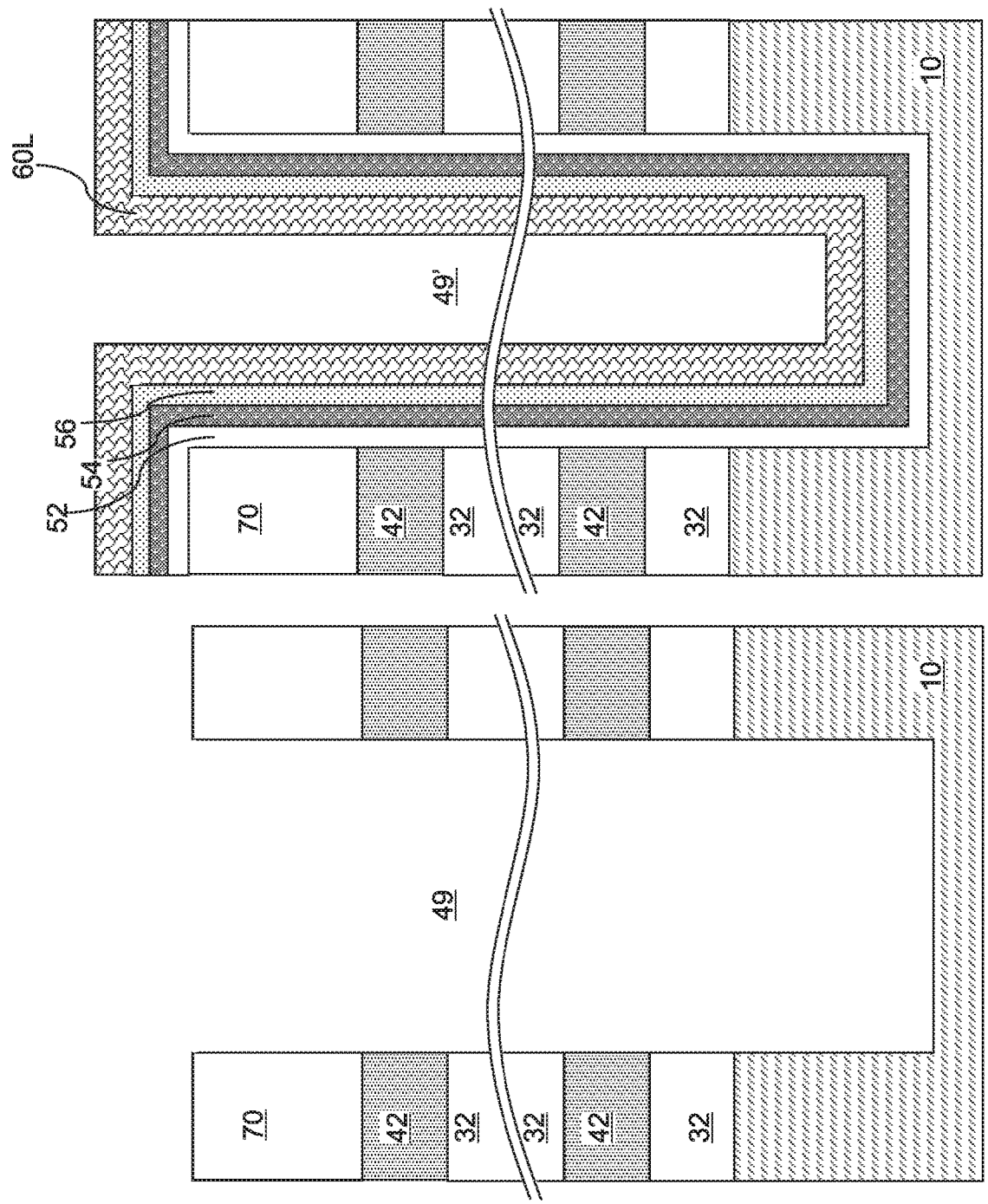

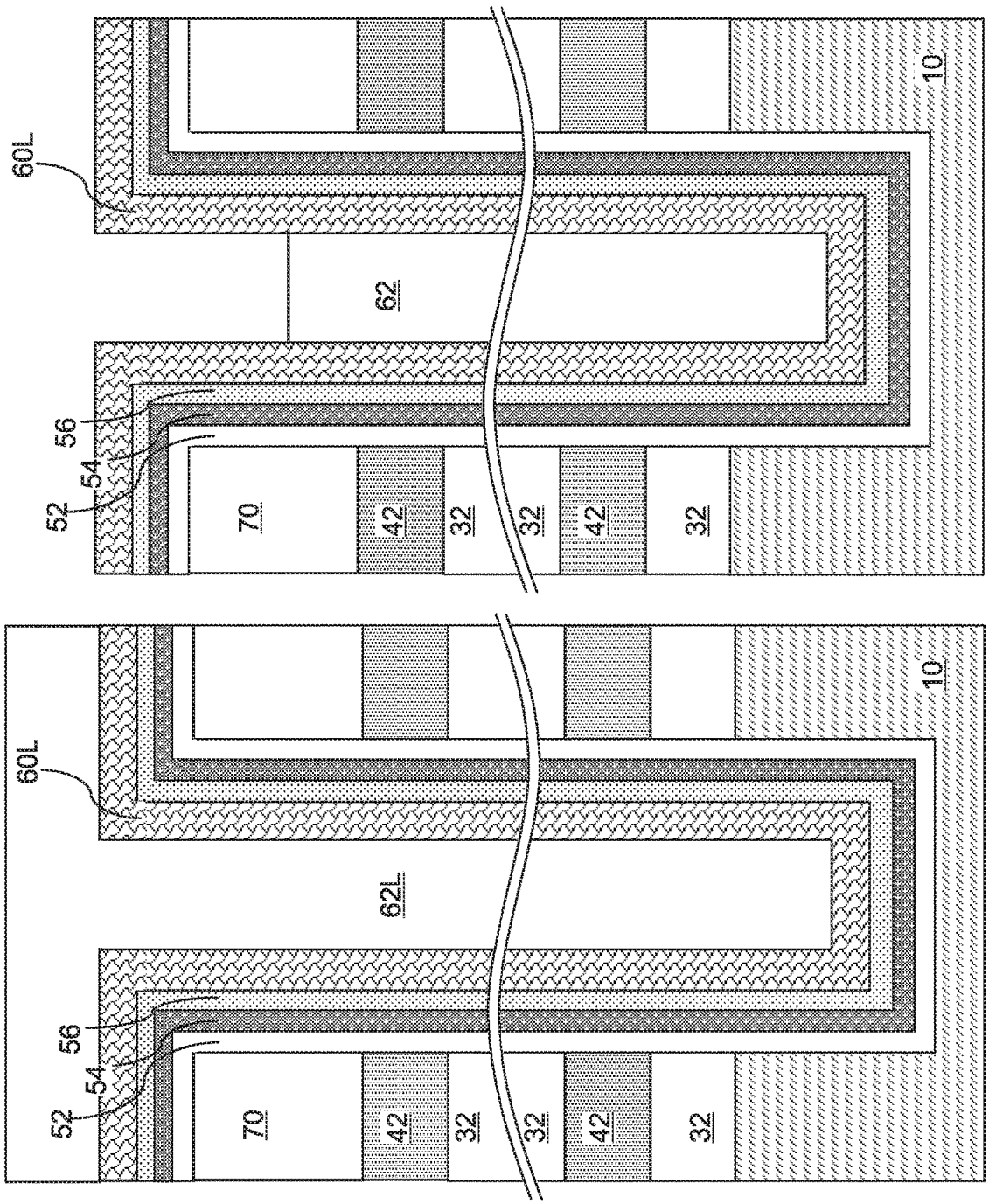

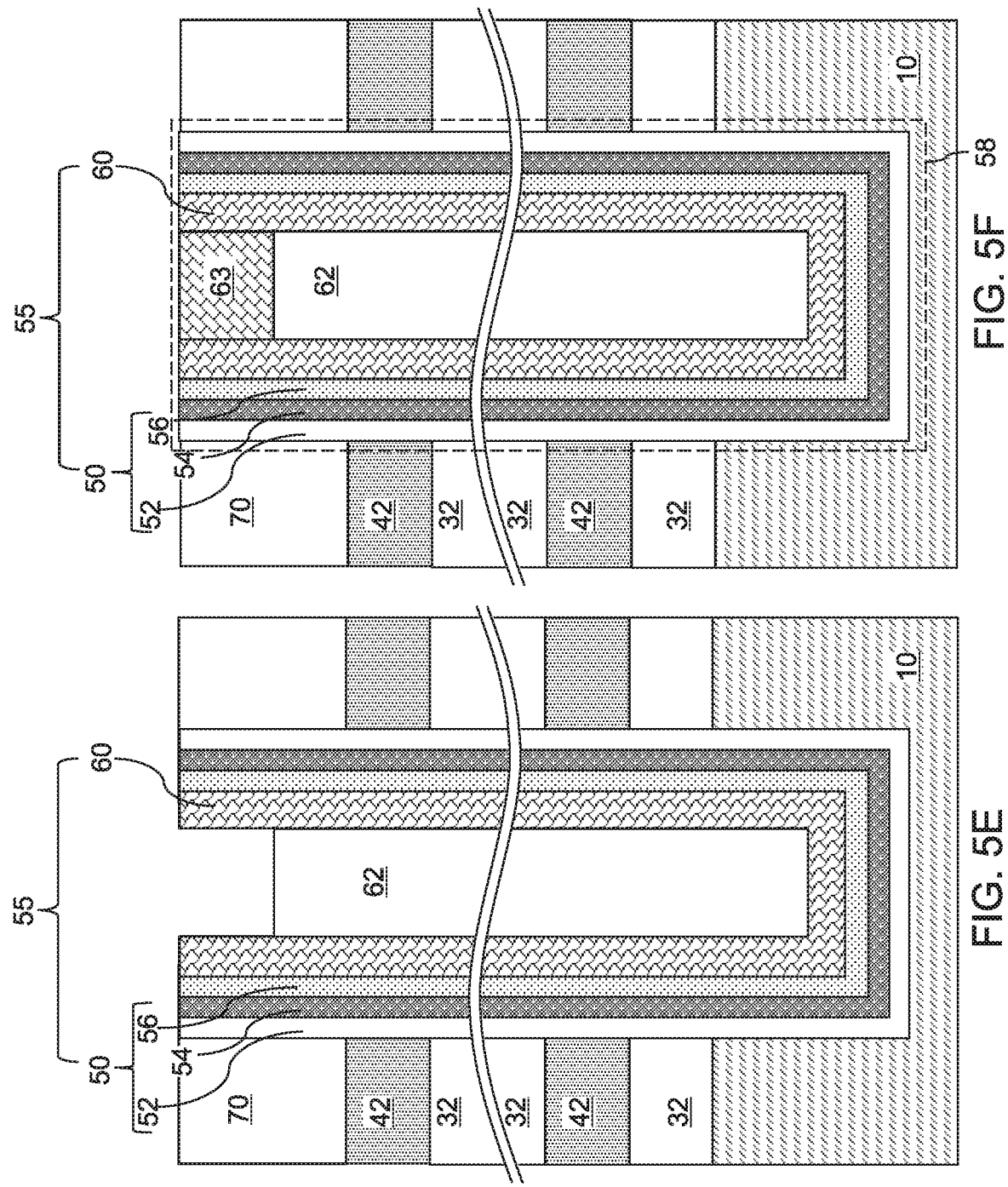

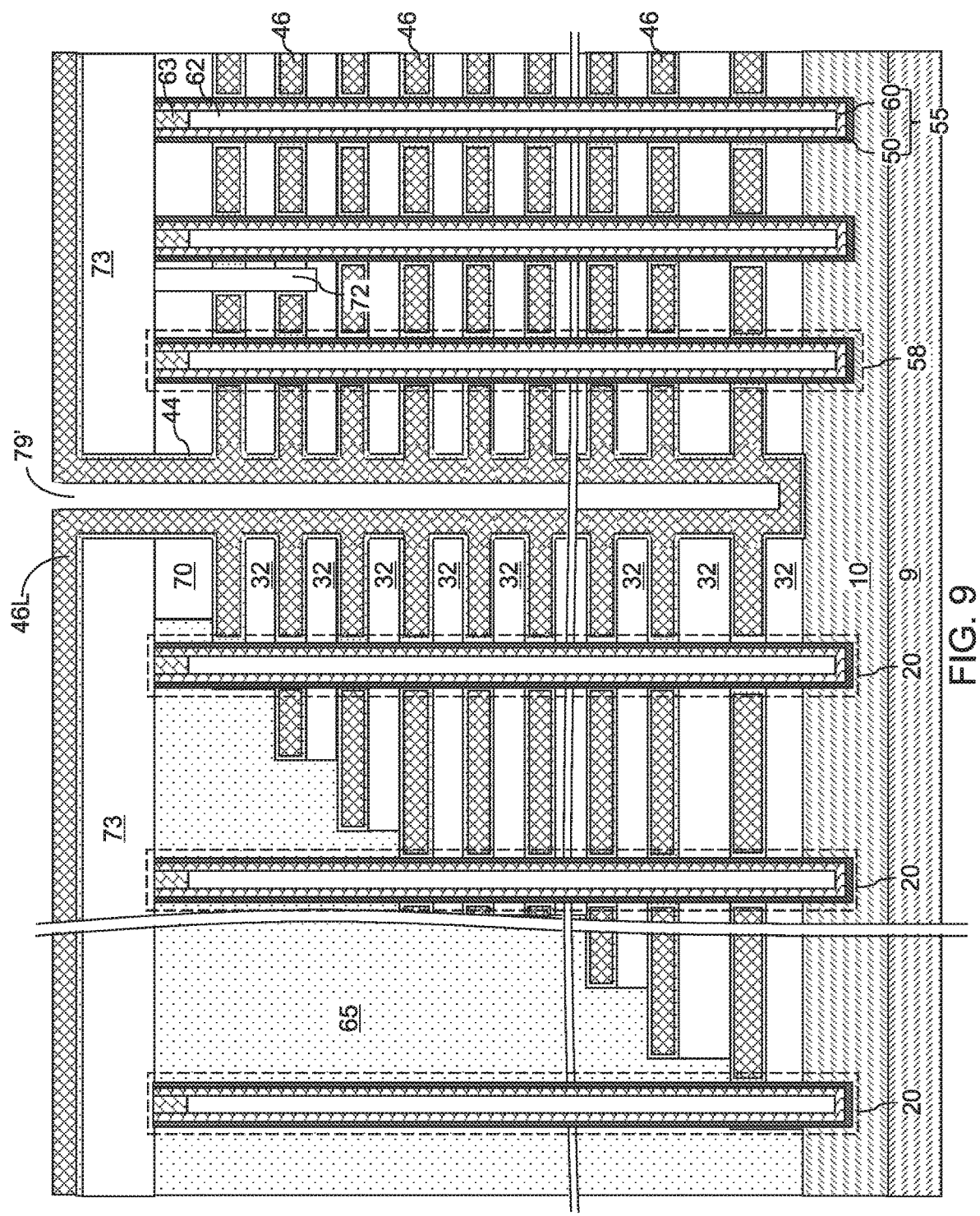

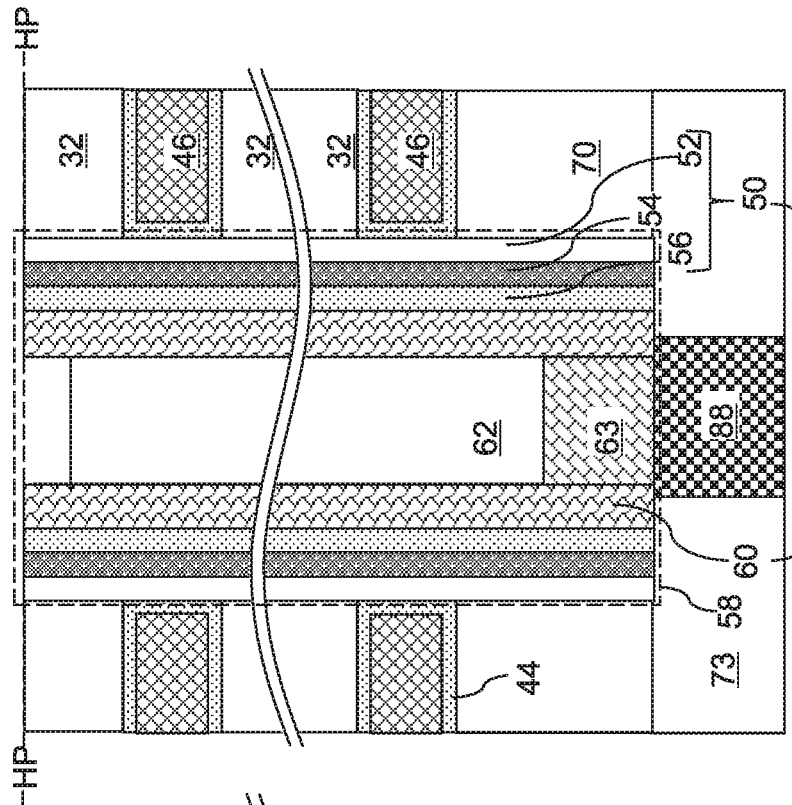
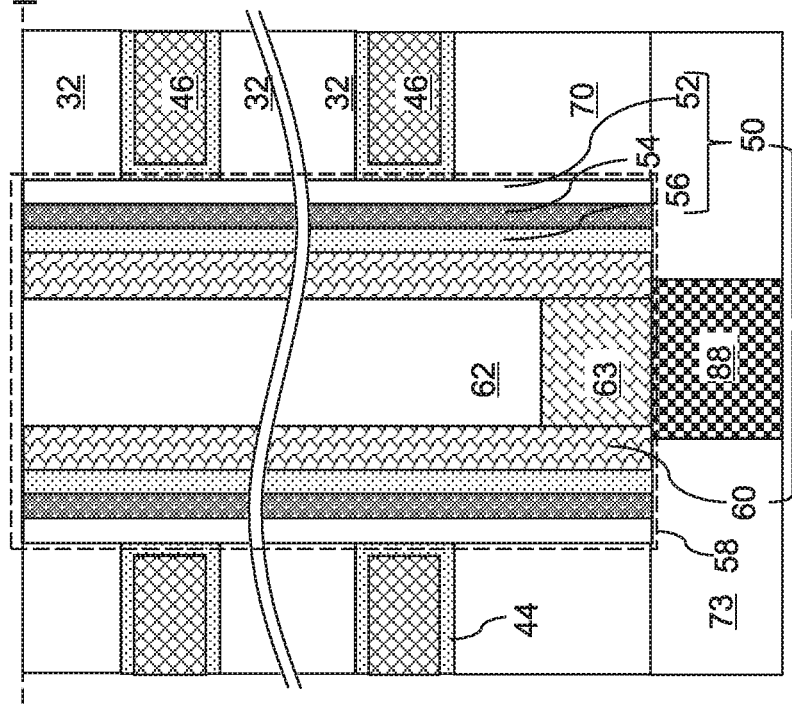

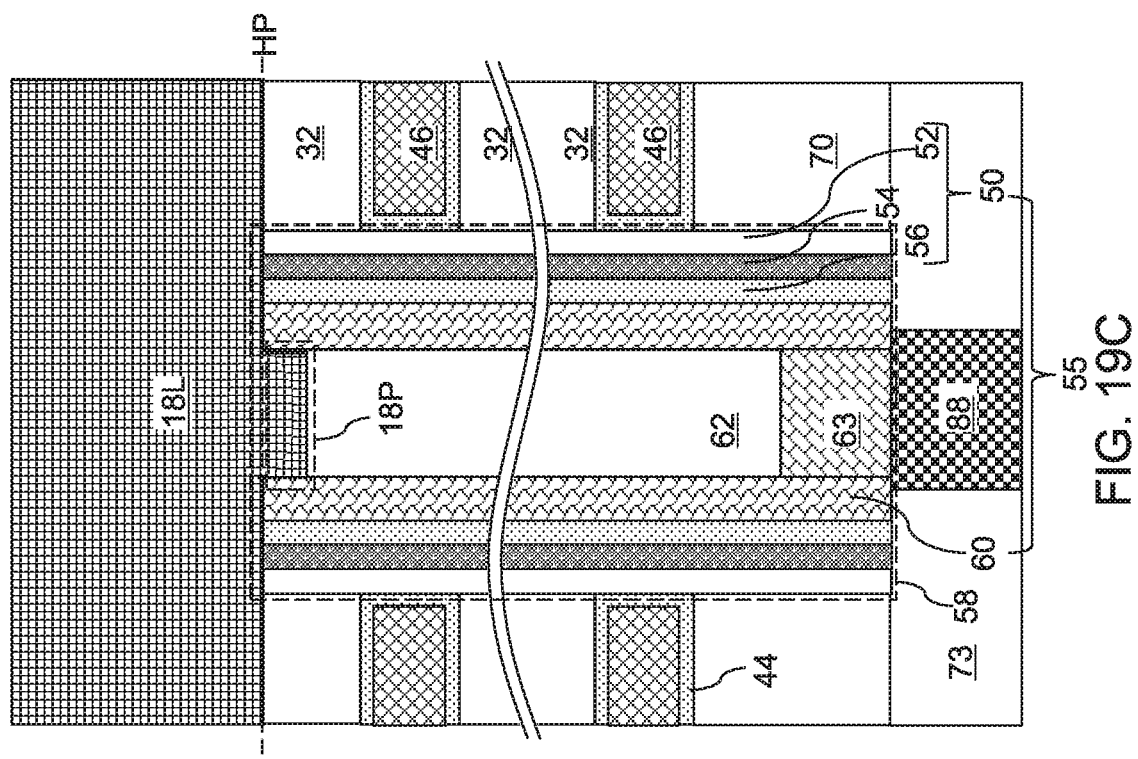

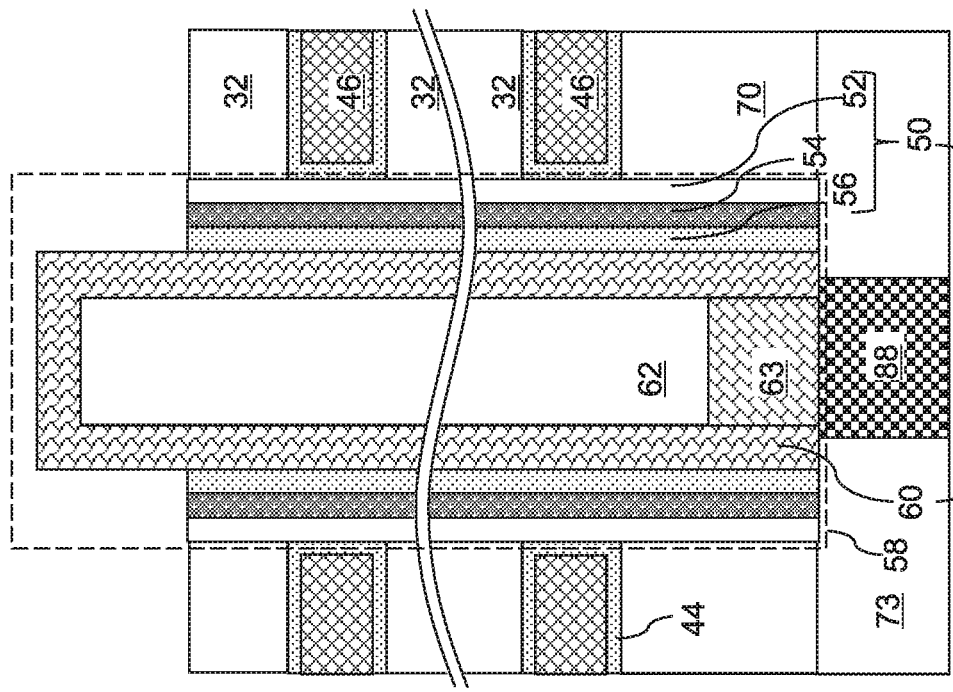
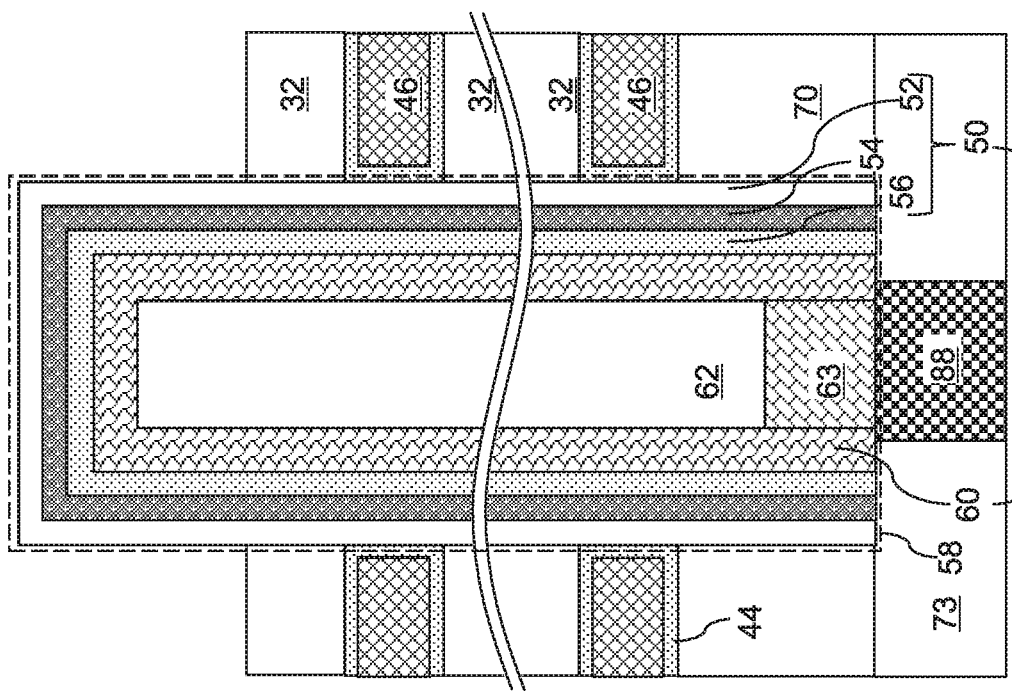

US 11,195,857 B2

BONDED THREE-DIMENSIONAL MEMORY DEVICES AND METHODS OF MAKING THE SAME BY REPLACING CARRIER SUBSTRATE WITH SOURCE LAYER

FIELD

The present disclosure relates generally to the field of semiconductor devices, and particularly to bonded three-dimensional memory devices and methods of making the same by replacing a carrier substrate with source layer and contact structures.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36. Support circuitry for performing write, read, and erase operations of the memory cells in the vertical NAND strings typically are provided by complementary metal oxide semiconductor (CMOS) devices formed on a same substrate as the three-dimensional memory device. using

SUMMARY

According to an aspect of the present disclosure, a three-dimensional memory device comprises: an alternating stack of insulating layers and electrically conductive layers; memory stack structures extending through the alternating stack, wherein each of the memory stack structures comprises a respective vertical semiconductor channel and a respective memory film; drain regions located at a first end of a respective one of the vertical semiconductor channels; a source layer having a first surface and a second surface, wherein the first surface is located at a second end of each of the vertical semiconductor channels. The first end of each of the vertical semiconductor channels is closer to the logic die than the second end of each of the vertical semiconductor channels. A semiconductor wafer is not located over a second surface of the source layer.

According to another aspect of the present disclosure, a method of forming a three-dimensional memory device is provided, which comprises: forming an alternating stack of insulating layers and spacer material layers over a carrier substrate, wherein the spacer material layers are formed as, or are subsequently replaced with, electrically conductive layers; forming memory stack structures through the alternating stack, wherein each of the memory stack structures comprises a respective vertical semiconductor channel and a respective memory film; physically exposing a distal end of each of the vertical semiconductor channels by removing the carrier substrate; and forming a source layer directly on the distal end each of the vertical semiconductor channels.

BRIEF DESCRIPTION OF THE DRAWINGS

FIGS. 5A-5F are sequential schematic vertical cross-sectional views of a memory opening within the exemplary structure during formation of a memory stack structure, an optional dielectric core, and a drain region therein according to an embodiment of the present disclosure.

FIG. 9 is a schematic vertical cross-sectional view of the exemplary structure after formation of electrically conductive layers according to an embodiment of the present disclosure.

FIGS. 19A-19C are sequential vertical cross-sectional views of a first configuration for a memory opening fill structure during various processing steps up to deposition of a doped semiconductor material layer according to an embodiment of the present disclosure.

FIGS. 22A-22C are sequential vertical cross-sectional views of a second configuration for a memory opening fill structure during various processing steps up to deposition of a doped semiconductor material layer according to an embodiment of the present disclosure.

DETAILED DESCRIPTION

Figure 1:
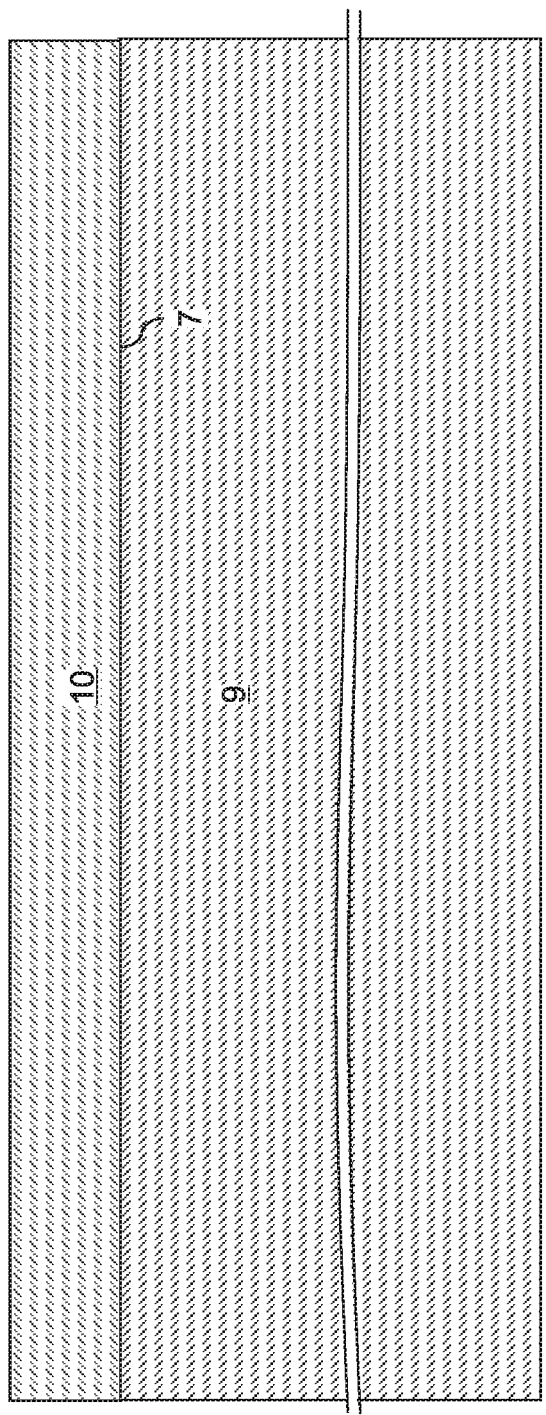
FIG. 1 is a schematic vertical cross-sectional view of an exemplary including a carrier substrate according to an embodiment of the present disclosure.

As discussed above, the embodiments of the present disclosure are directed to three-dimensional memory devices and methods of forming bonded three-dimensional memory devices by replacement of a carrier substrate with a source layer and contact structures, the various aspects of which are described below. The embodiments of the present disclosure can be used to form various structures including a multilevel memory structure, non-limiting examples of which include semiconductor devices such as three-dimensional monolithic memory array devices comprising a plurality of NAND memory strings. The embodiments of the present disclosure can be used to form a bonded assembly of multiple semiconductor dies including a memory die. Support circuitry (also referred to as peripheral or driver circuitry) used to perform write, read, and erase operations of the memory cells in the vertical NAND strings may be implemented in CMOS devices formed on a same substrate as the three-dimensional memory device. In such devices, design and manufacturing consideration is that degradation of CMOS devices due to collateral thermal cycling and hydrogen diffusion during manufacture of the three-dimensional memory device places severe constraints on performance of the support circuitry. Various embodiments include methods that provide high-performance support circuitry for three-dimensional memory device. Various embodiments include methods that provide a source layer in three-dimensional memory devices that is easier to implement than conventional methods.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "proto-type" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices according to various embodiments of the present disclosure include a monolithic three-dimensional NAND string memory device, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, an exemplary structure according to an embodiment of the present disclosure is illustrated, which can be used, for example, to fabricate a device structure containing vertical NAND memory devices. The exemplary structure includes a carrier substrate 9 and a semiconductor material layer 10 located on a top surface of the carrier substrate 9. In one embodiment, the carrier substrate 9 and the semiconductor material layer 10 may be provided as a commercially available single crystalline semiconductor wafer. A surface portion of the single crystalline semiconductor wafer can include the semiconductor material layer 10, and a bulk portion of the single crystalline semiconductor wafer can include the carrier substrate 9 that is subsequently removed, for example, by backside grinding. An interface 7 between the carrier substrate 9 and the semiconductor material layer 10 can be located at a depth that corresponds to a target stopping plane for the backside grinding process. Alternatively, the semiconductor material layer 10 can include a single crystalline or polycrystalline semiconductor material layer provided on the carrier substrate 9 including a material different from the material of the semiconductor material layer 10. In this case, the carrier substrate 9 can include an insulating material (such as sapphire or silicon oxide), a conductive material, or a semiconductor material different from the material of the semiconductor material layer 10. The thickness of the carrier substrate 9 can be thick enough to mechanically support the semiconductor material layer 10 and structures to be subsequently formed thereupon. For example, the carrier substrate 9 can have a thickness in a range from 60 microns to 1,000 microns. The thickness of the semiconductor material layer 10 may be in a range from 100 nm to 5,000 nm, although lesser and greater thicknesses can also be used. The semiconductor material layer 10 includes at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 2:
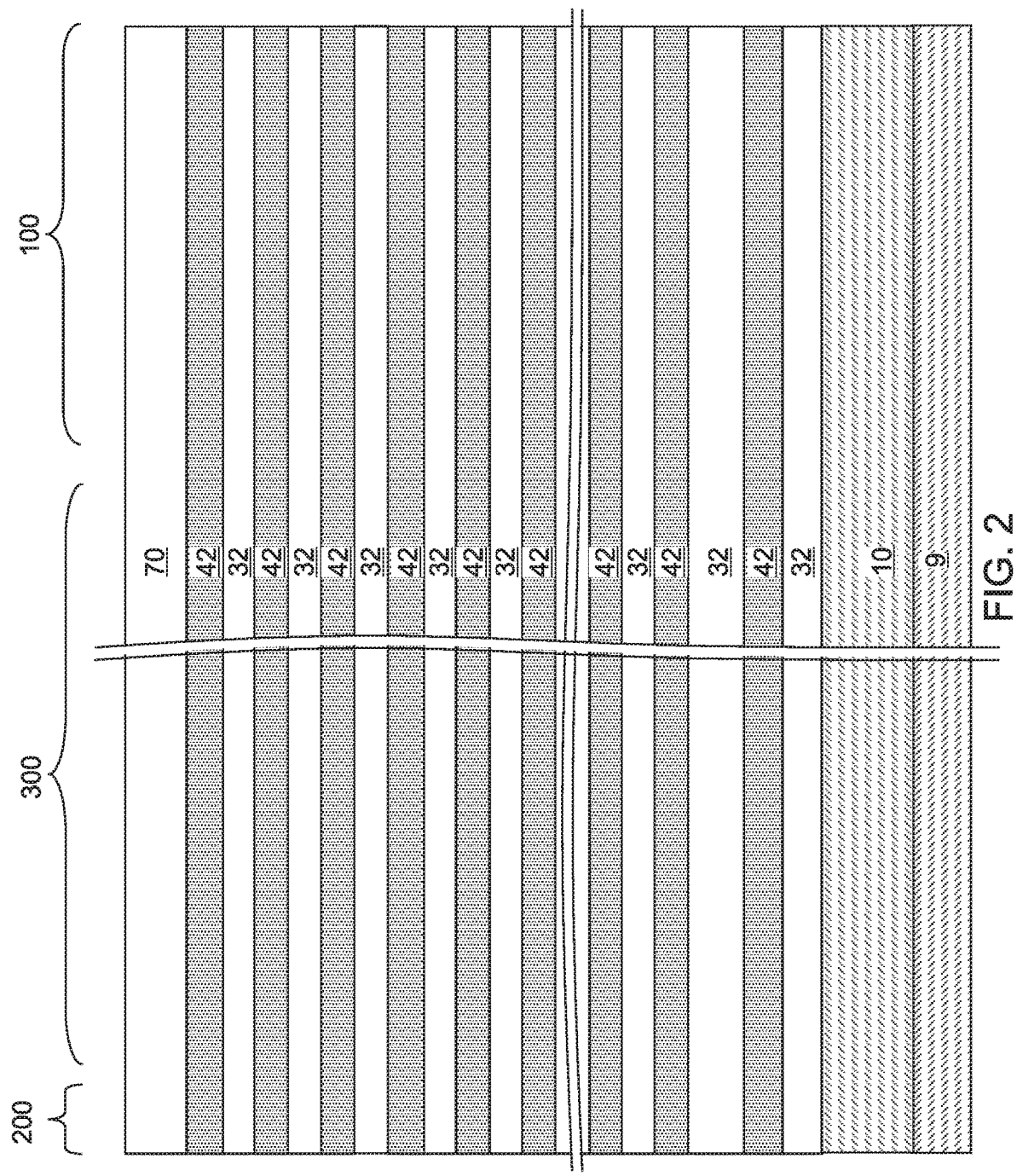
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer.

Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The exemplary structure can include at least one memory array region 100 in which a three-dimensional array of memory elements is to be subsequently formed, at least one staircase region 300 in which stepped surfaces of the alternating stack (32, 42) are to be subsequently formed, and an interconnection region 200 in which interconnection via structures extending through the levels of the alternating stack (32, 42) are to be subsequently formed.

Figure 3:
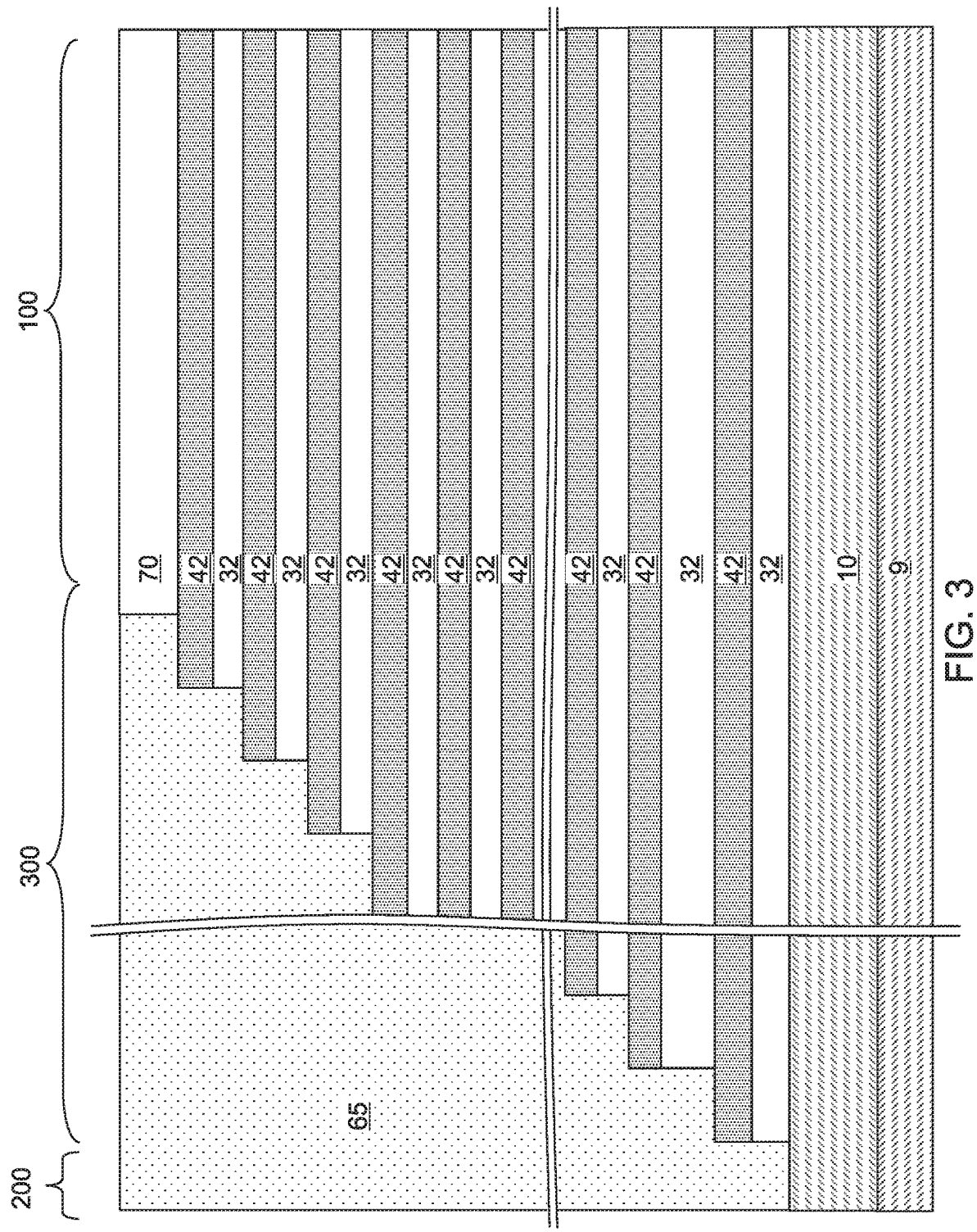
FIG. 3 is a schematic vertical cross-sectional view of the exemplary structure after formation of stepped surfaces and a stepped dielectric material portion according to an embodiment of the present disclosure.

Referring to FIG. 3, stepped surfaces are formed in the staircase region 300, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the interconnection region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the carrier substrate 9.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
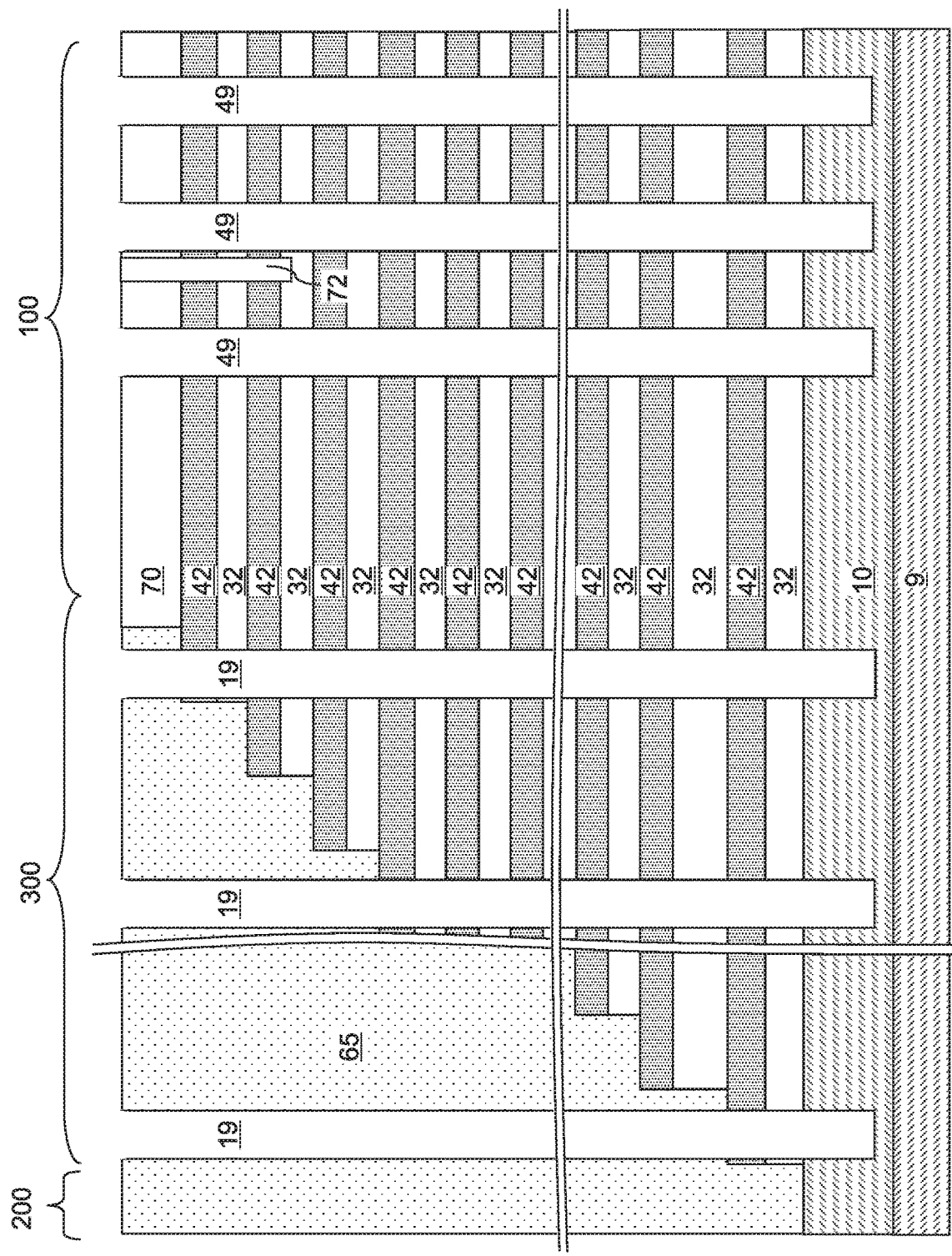
FIG. 4A is a schematic vertical cross-sectional view of the exemplary structure after formation of memory openings and support openings according to an embodiment of the present disclosure.
Figure 4B:
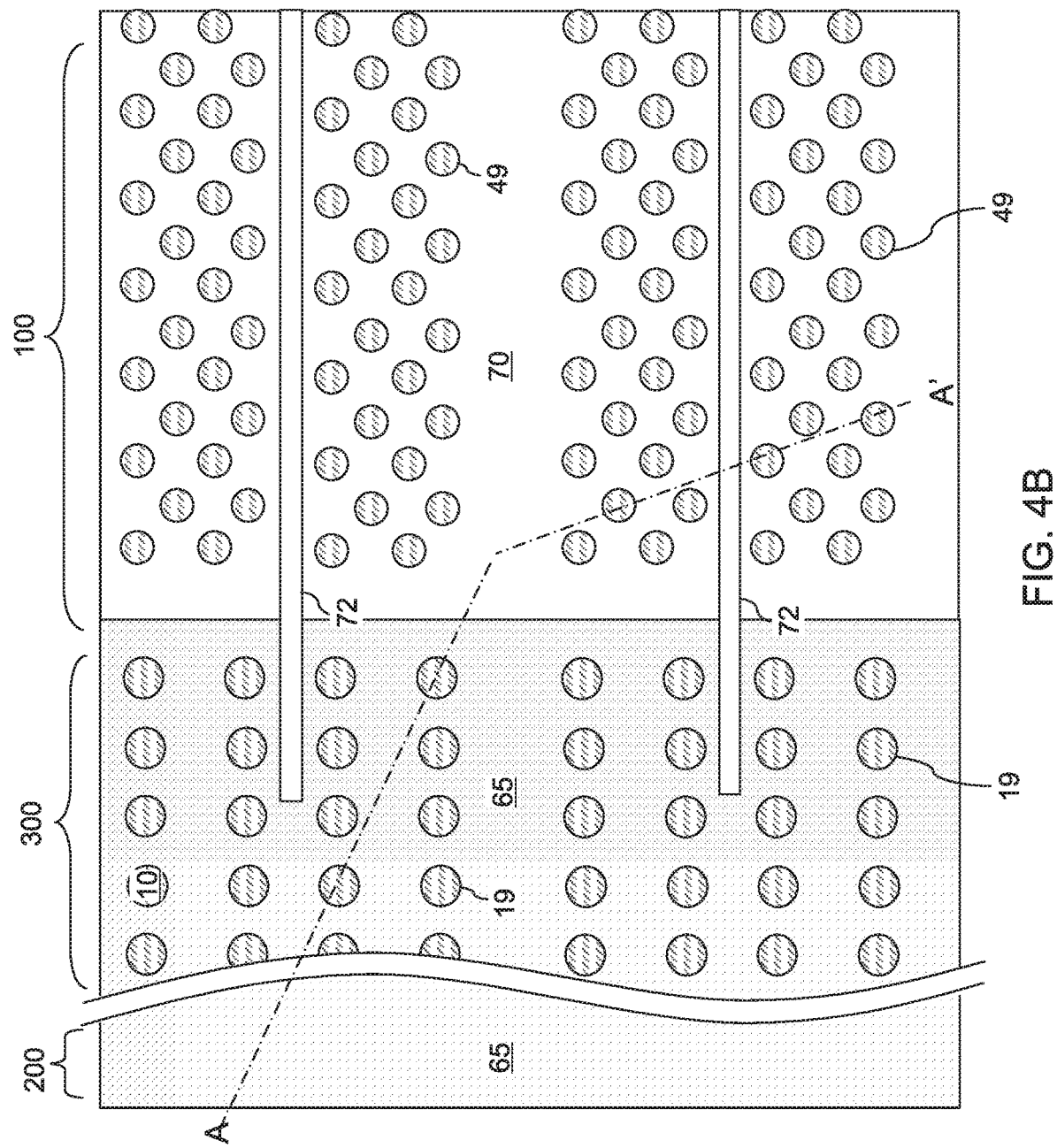
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300.

FIGS. 5A-5F illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, a stack of layers including a blocking dielectric layer 52, a charge storage layer 54, a tunneling dielectric layer 56, and a semiconductor channel layer 60L can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be used. A memory cavity 49' is formed in the volume of each memory opening 49 that is not filled with the deposited material layers (52, 54, 56, 60L).

Referring to FIG. 5C, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5D, the dielectric core layer 62L can be recessed selective to the material of the semiconductor channel layer 60L, for example, by a recess etch. The material of the dielectric core layer 62L is vertically recessed below the horizontal plane including the top surface of the insulating cap layer 70. Each remaining portion of the dielectric core layer 62L constitutes a dielectric core 62.

Referring to FIG. 5E, the horizontal portions of the semiconductor channel layer 60L, the tunneling dielectric layer 56, the charge storage layer 54, and the blocking dielectric layer 52 can be removed from above the top surface of the insulating cap layer 70 by a planarization process. A series of recess etch processes can be used, which may include at least one anisotropic etch step and/or at least one isotropic etch step. Each remaining portion of the semiconductor channel layer 60L can be located entirely within a memory opening 49 or entirely within a support opening 19.

Each remaining portion of the semiconductor channel layer 60L constitutes a vertical semiconductor channel 60. Electrical current can flow through each vertical semiconductor channel 60 when a vertical NAND device including the vertical semiconductor channel 60 is turned on. Within each memory opening 49, a tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 constitutes a memory stack structure 55.

Referring to FIG. 5F, drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each memory stack structure 55 is a combination of a semiconductor channel, a tunneling dielectric layer, a plurality of memory elements comprising portions of the charge storage layer 54, and an optional blocking dielectric layer 52. Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 constitutes a support pillar structure.

Figure 6:
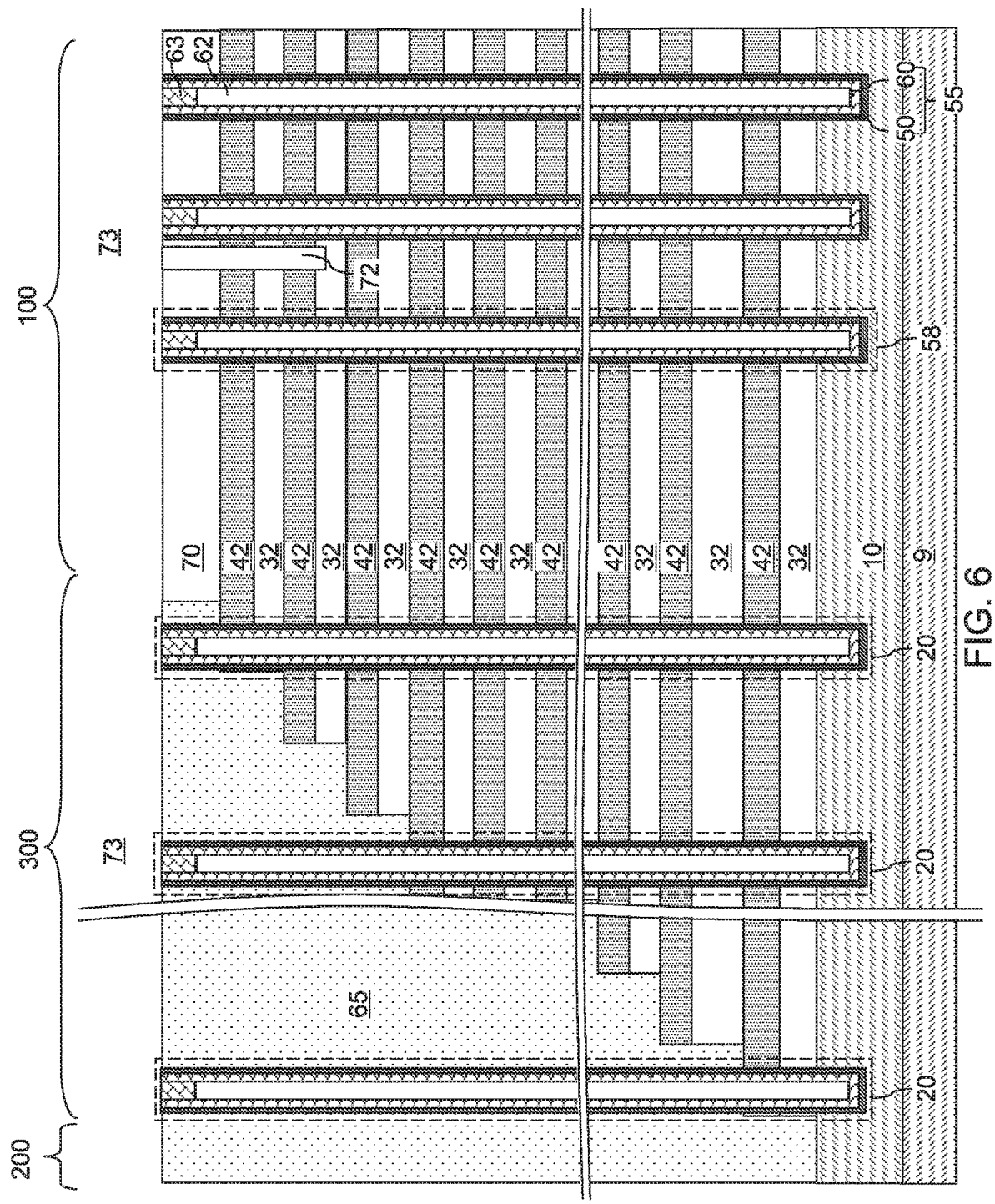
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical semiconductor channel 60 of the support pillar structure 20) having a same composition as the vertical semiconductor channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described using the illustrated configuration for the memory stack structure, the methods of the present disclosure can be applied to alternative memory stack structures including different layer stacks or structures for the memory film 50 and/or for the vertical semiconductor channel 60.

Figure 7A:
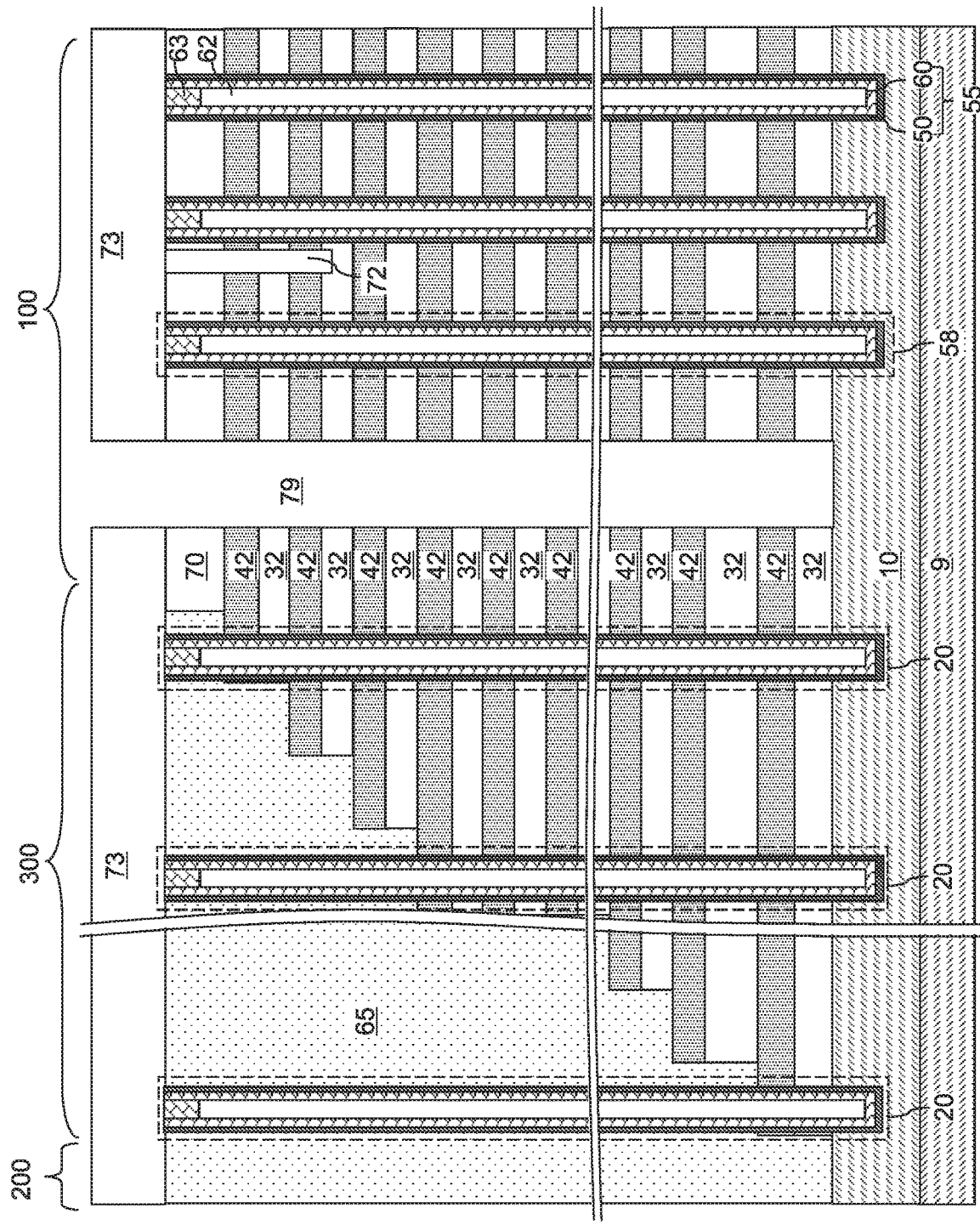
FIG. 7A is a schematic vertical cross-sectional view of the exemplary structure after formation of backside trenches according to an embodiment of the present disclosure.
Figure 7B:
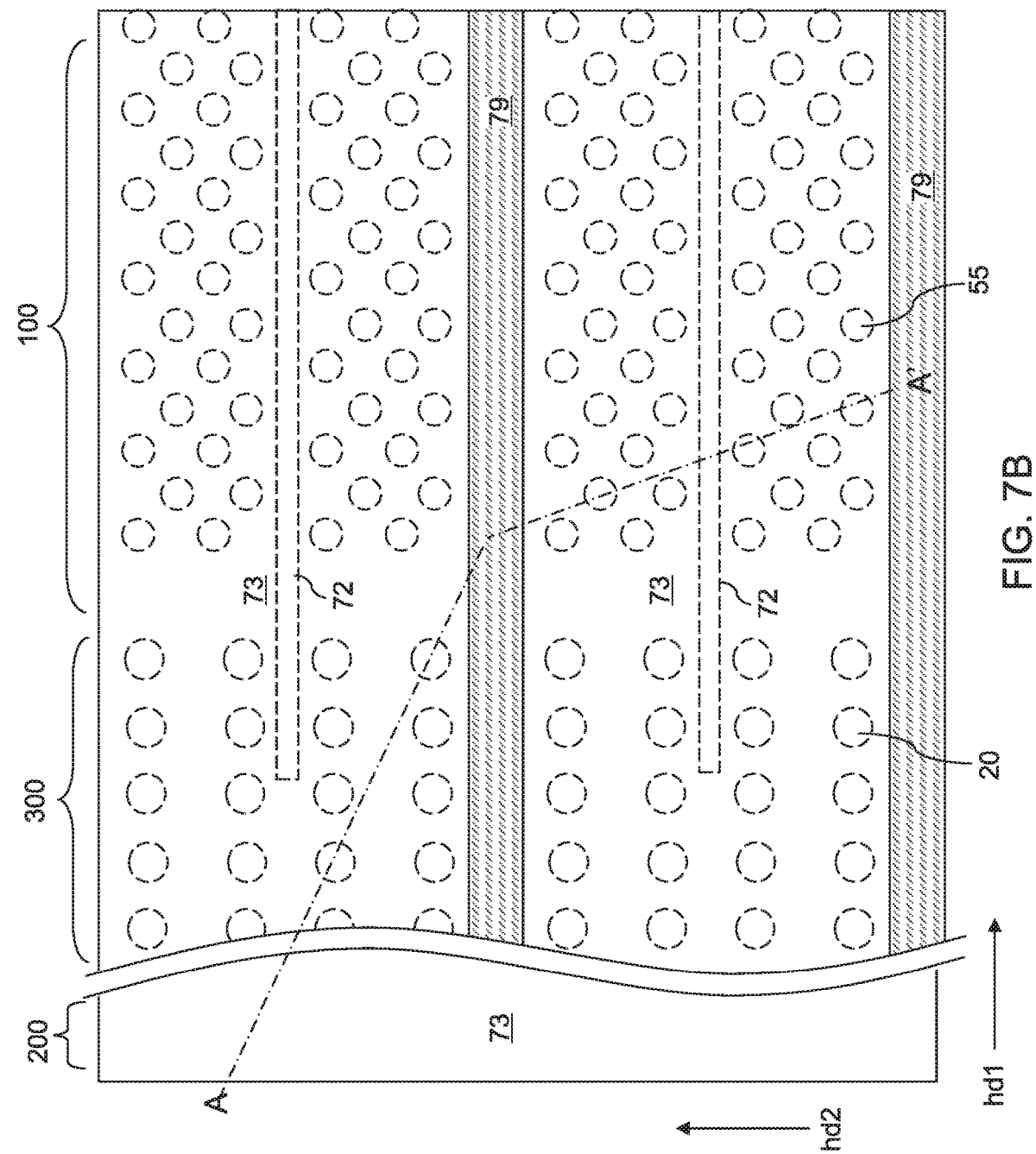
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the stepped dielectric material portion 65 using an anisotropic etch to form backside trenches 79, which vertically extend from the top surface of the contact level dielectric layer 73 at least to the top surface of the substrate semiconductor material layer 10, and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
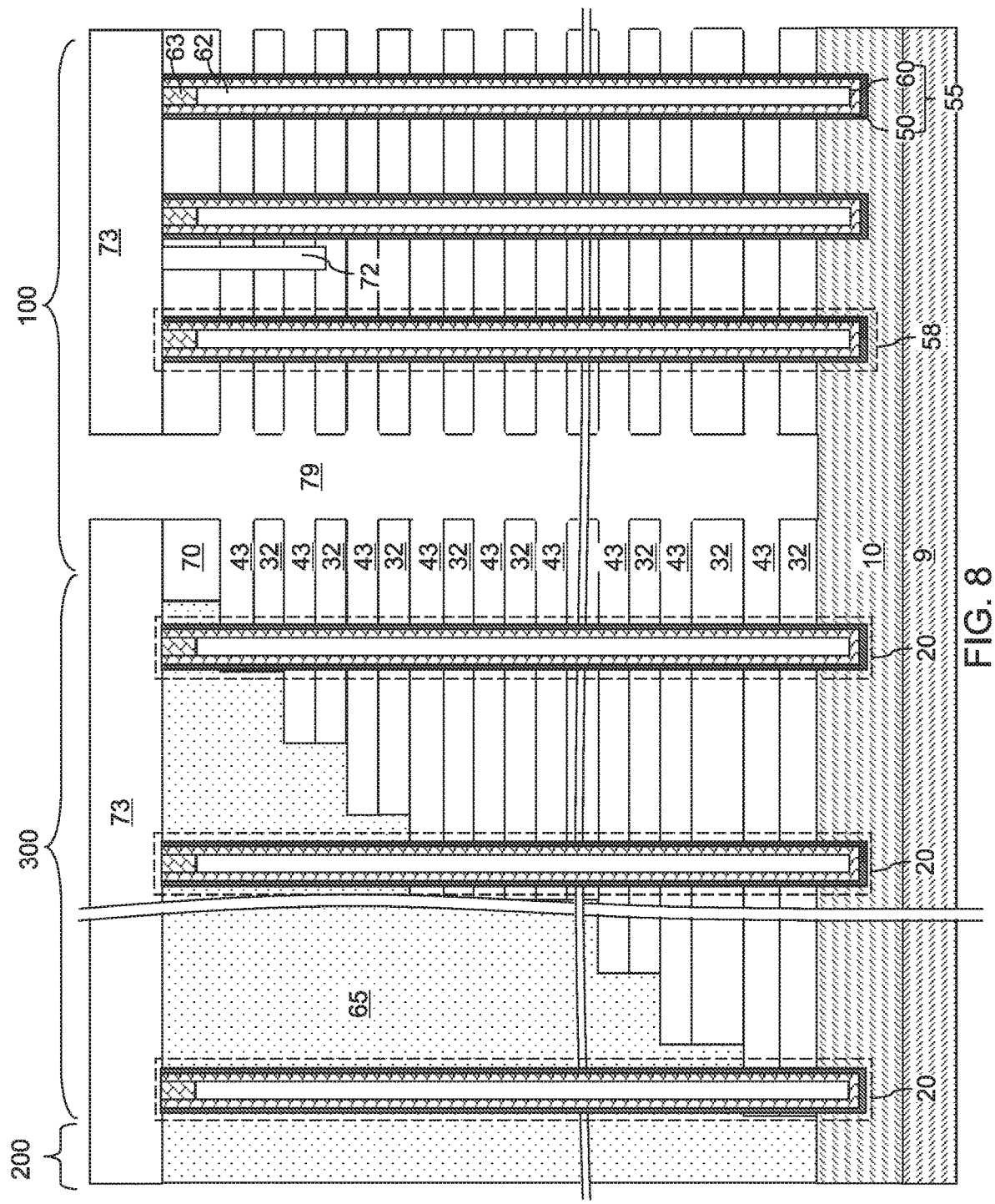
FIG. 8 is a schematic vertical cross-sectional view of the exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate semiconductor material layer 10. In this case, each backside recess 43 can define a space for receiving a respective word line of the array of monolithic three-dimensional NAND strings.

Each of the plurality of backside recesses 43 can extend substantially parallel to the top surface of the substrate semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout.

Referring to FIG. 9, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

At least one metallic material is deposited in the plurality of backside recesses 43, on the sidewalls of the at least one the backside trench 79, and over the top surface of the contact level dielectric layer 73. The at least one metallic material can include a conductive metal nitride material (such as TiN, TaN, or WN) and a metallic fill material (such as W, Co, Ru, Ti, and/or Ta). Each metallic material can be deposited by a conformal deposition method, which can be, for example, chemical vapor deposition (CVD), atomic layer deposition (ALD), electroless plating, electroplating, or a combination thereof.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer 46L includes a continuous portion of the metallic barrier layer and a continuous portion of the metallic fill material layer that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L.

Figure 10A:
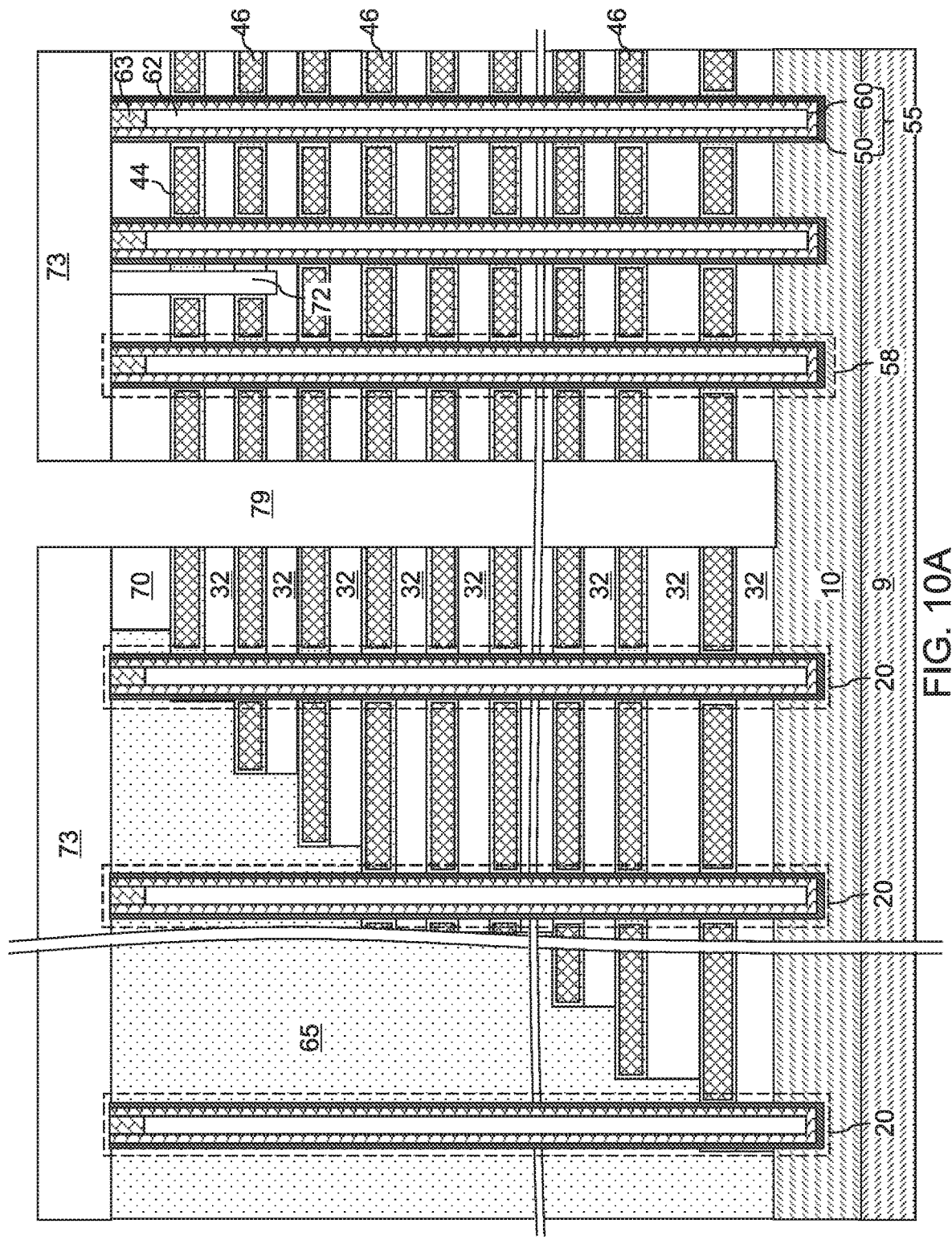
FIG. 10A is a schematic vertical cross-sectional view of the exemplary structure after removal of a deposited conductive material from within the backside trench according to an embodiment of the present disclosure.
Figure 10B:
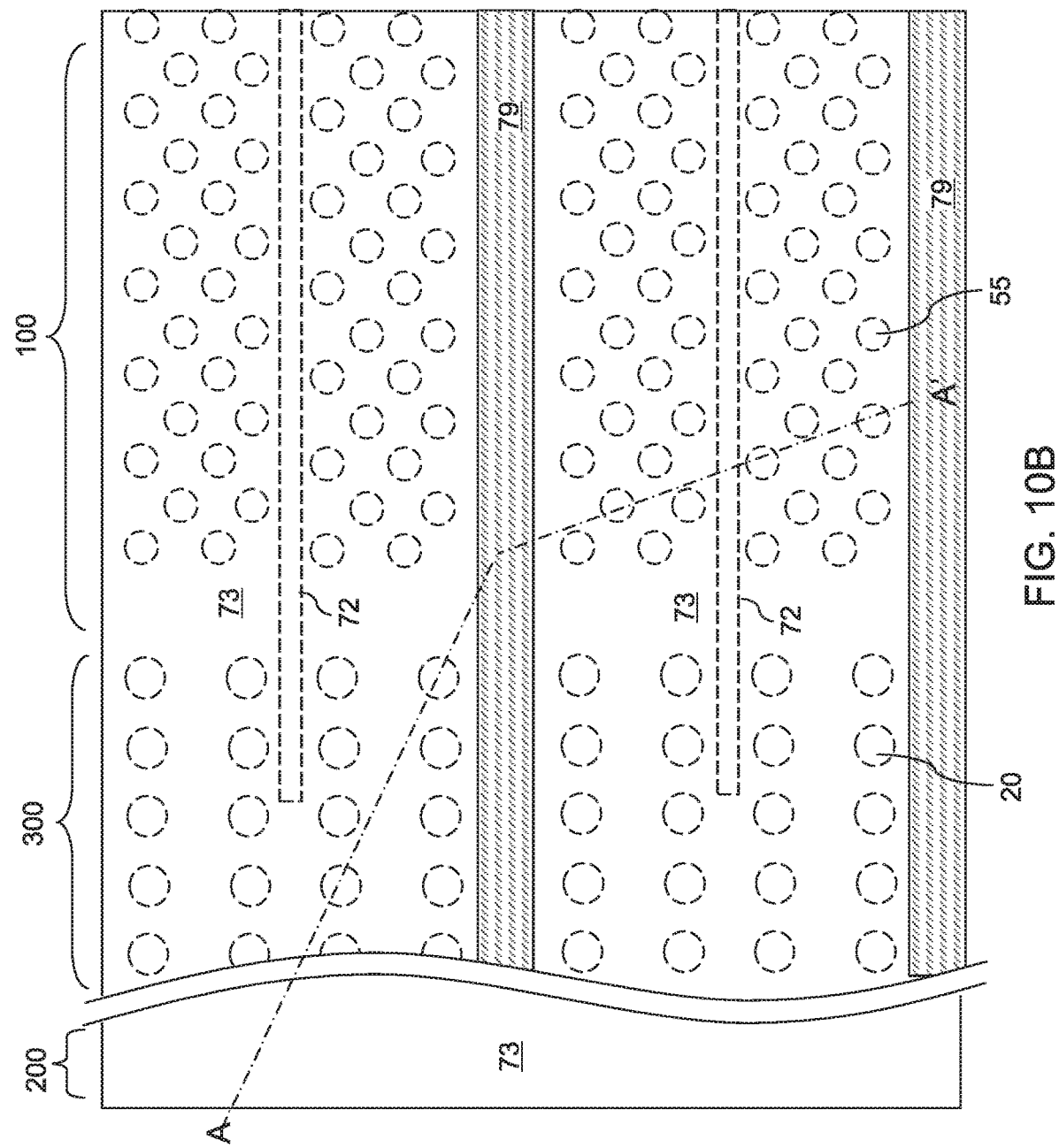
FIG. 10B is a partial see-through top-down view of the exemplary structure of FIG. 10A. The vertical plane A-A' is the plane of the schematic vertical cross-sectional view of FIG. 10A.

Referring to FIGS. 10A and 10B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. A backside cavity 79' is present within each backside trench 79.

Figure 11:
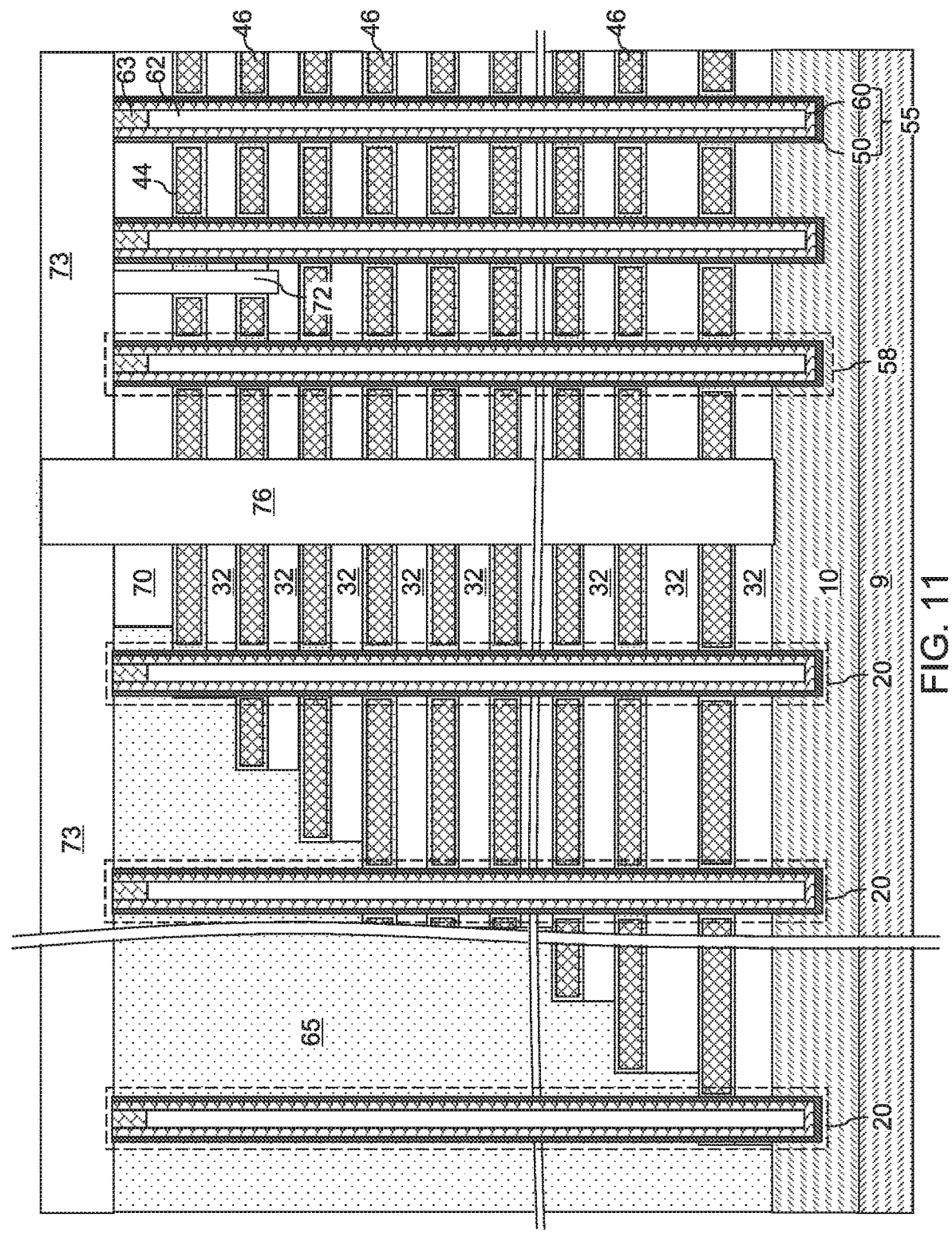
FIG. 11 is a schematic vertical cross-sectional view of the exemplary structure after formation of insulating wall structures according to an embodiment of the present disclosure.

Referring to FIG. 11, a dielectric wall structure 76 can be formed within each backside cavity 79' by depositing at least one dielectric material in the remaining unfilled volume (i.e., the backside cavity 79') of the backside trench 79. The at least one dielectric material can include silicon oxide, silicon nitride, a dielectric metal oxide, an organosilicate glass, or a combination thereof. In one embodiment, the insulating material layer can include silicon oxide. The at least one dielectric material can be deposited, for example, by low pressure chemical vapor deposition (LPCVD) or atomic layer deposition (ALD). Optionally, the at least one dielectric material can be planarized using the contact level dielectric layer 73 as a stopping layer. If chemical mechanical planarization (CMP) process is used, the contact level dielectric layer 73 can be used as a CMP stopping layer. Each remaining continuous portion of the at least one conductive material in the backside trenches 79 constitutes a dielectric wall structure 76. The dielectric wall structures 76 can be formed between each neighboring pair of alternating stacks (32, 46) of insulating layers 32 and electrically conductive layers.

Figure 12A:
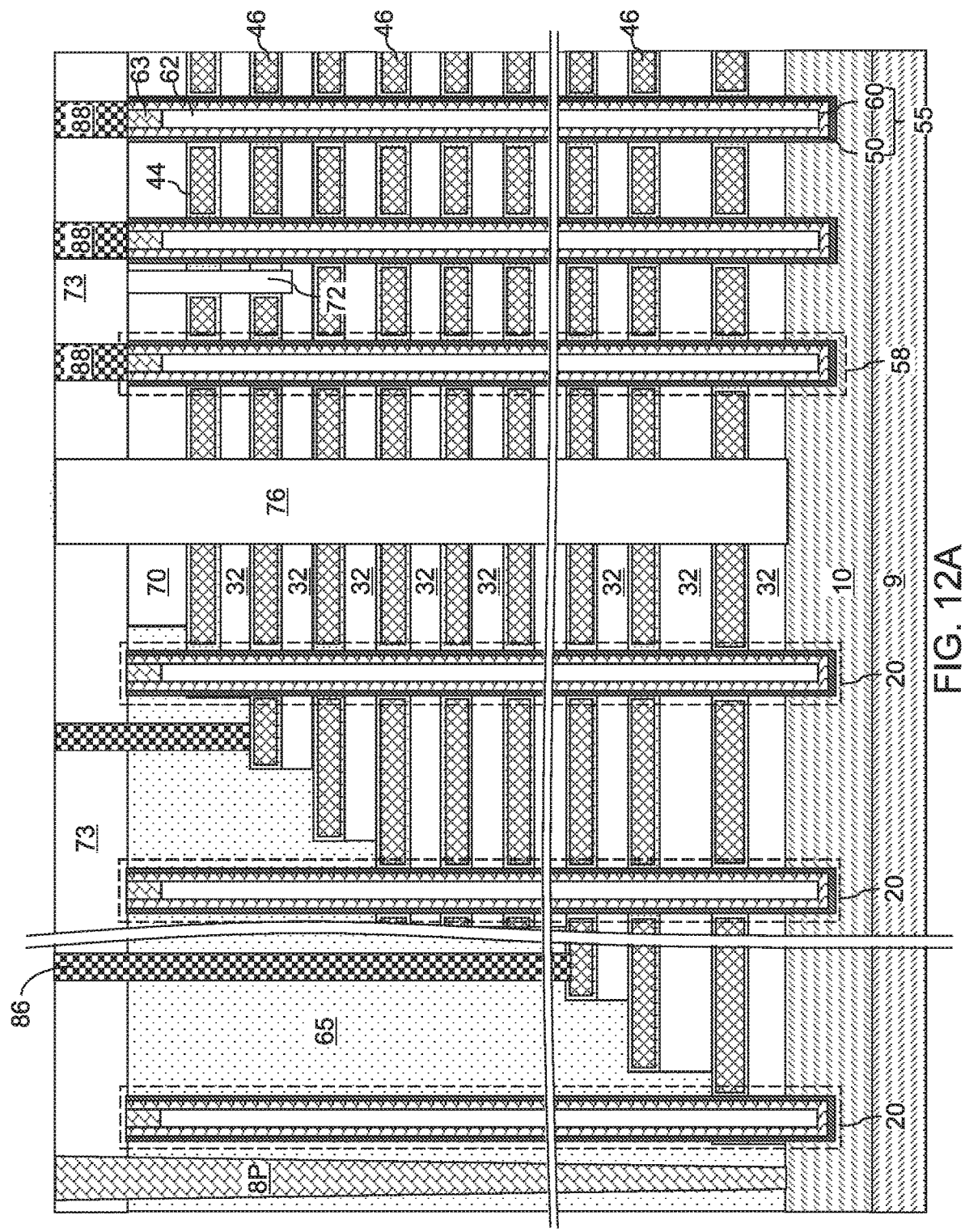
FIG. 12A is a schematic vertical cross-sectional view of the exemplary structure after formation of contact via structures according to an embodiment of the present disclosure.
Figure 12B:
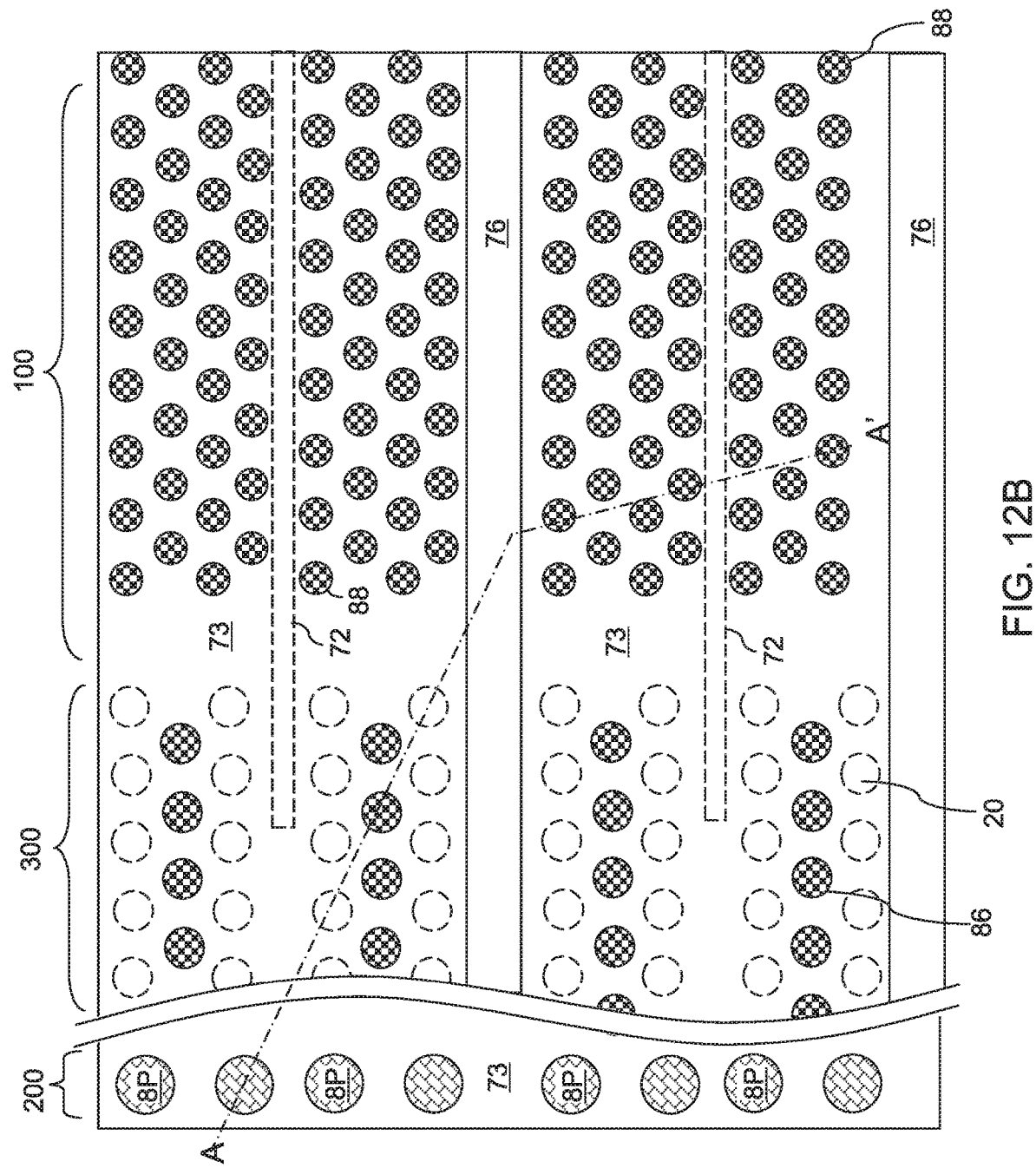
FIG. 12B is a top-down view of the exemplary structure of FIG. 12A. The vertical plane A-A' is the plane of the schematic vertical cross-sectional view of FIG. 12A.

Referring to FIGS. 12A and 12B, additional contact via structures (88, 86, 8P) can be formed through the contact level dielectric layer 73, and optionally through the stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the stepped dielectric material portion 65. Pass-through via structures 8P can be formed through the stepped dielectric material portion 65 to the semiconductor material layer 10.

Figure 13A:
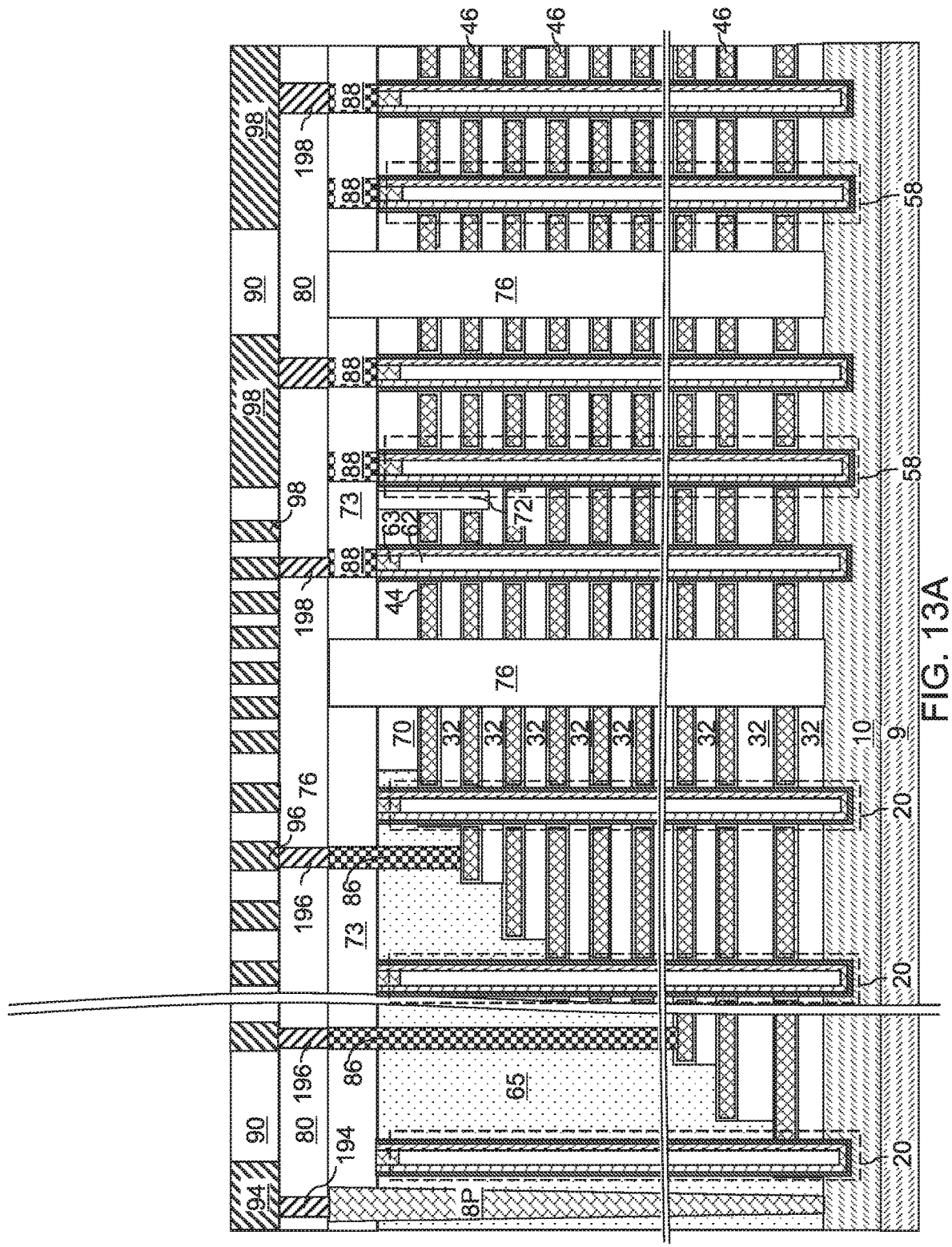
FIG. 13A is a schematic vertical cross-sectional view of the exemplary structure after formation of first via level metal interconnect structures and first line level metal interconnect structures according to an embodiment of the present disclosure.
Figure 13B:
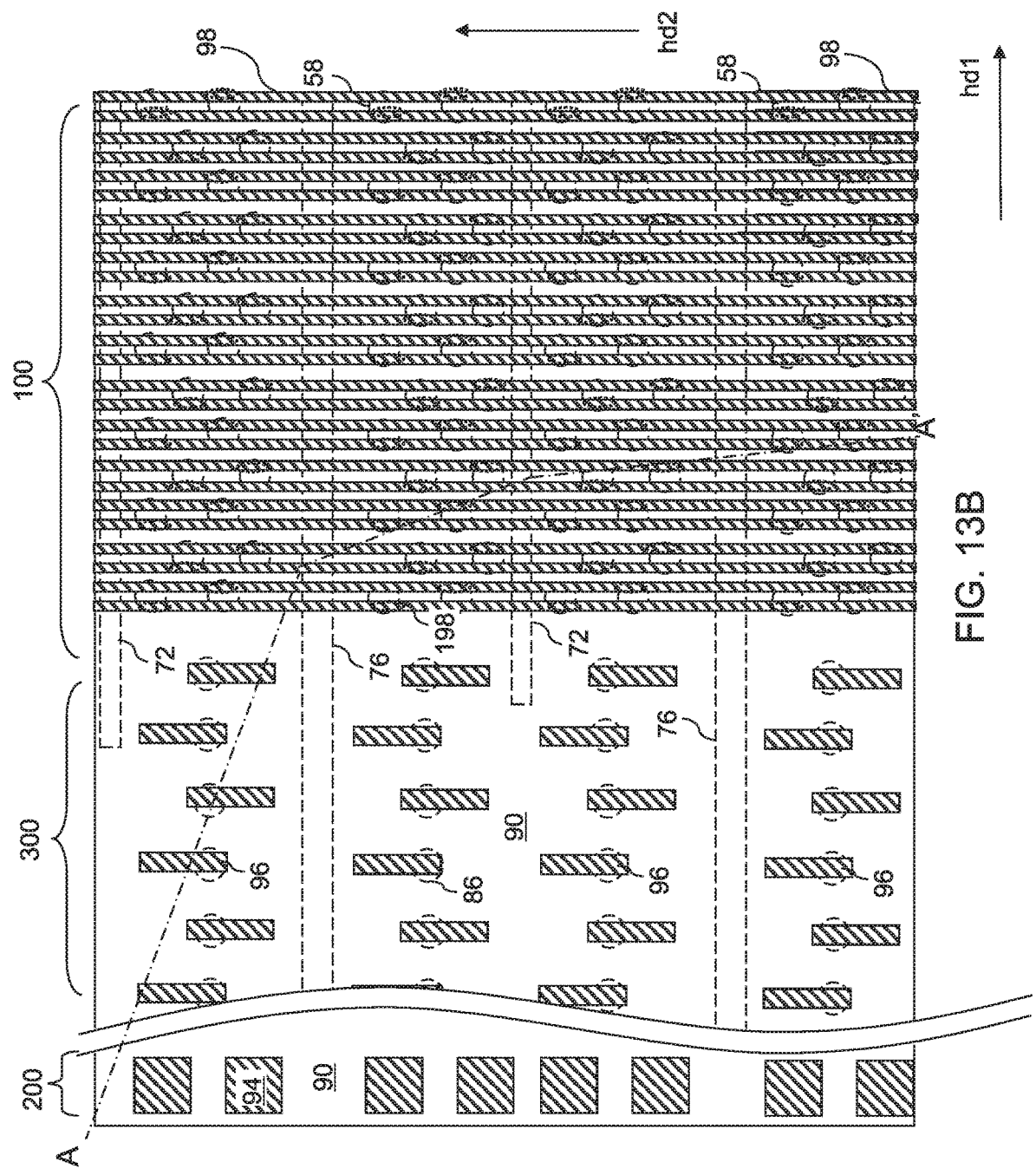
FIG. 13B is a partial see-through top-down view of the exemplary structure of FIG. 13A. The vertical plane A-A' is the plane of the schematic vertical cross-sectional view of FIG. 13A.

Referring to FIGS. 13A and 13B, a via level dielectric layer 80 is formed over the contact level dielectric layer 73. Various contact via structures (198, 196, 194) can be formed through the via level dielectric layer 80. For example, bit line connection via structures 198 can be formed on the drain contact via structures 88, word line connection via structures 196 can be formed on the word line contact via structures 86, and peripheral extension via structures 194 can be formed on the pass-through via structures 8P.

A first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical semiconductor channels 60 in the memory stack structures 55 in the memory array region 100. In one embodiment, the memory stack structures 55 are arranged in rows that extend along the first horizontal direction hd1, and the bit lines 98 laterally extend along the second horizontal direction hd2.

Figure 14:
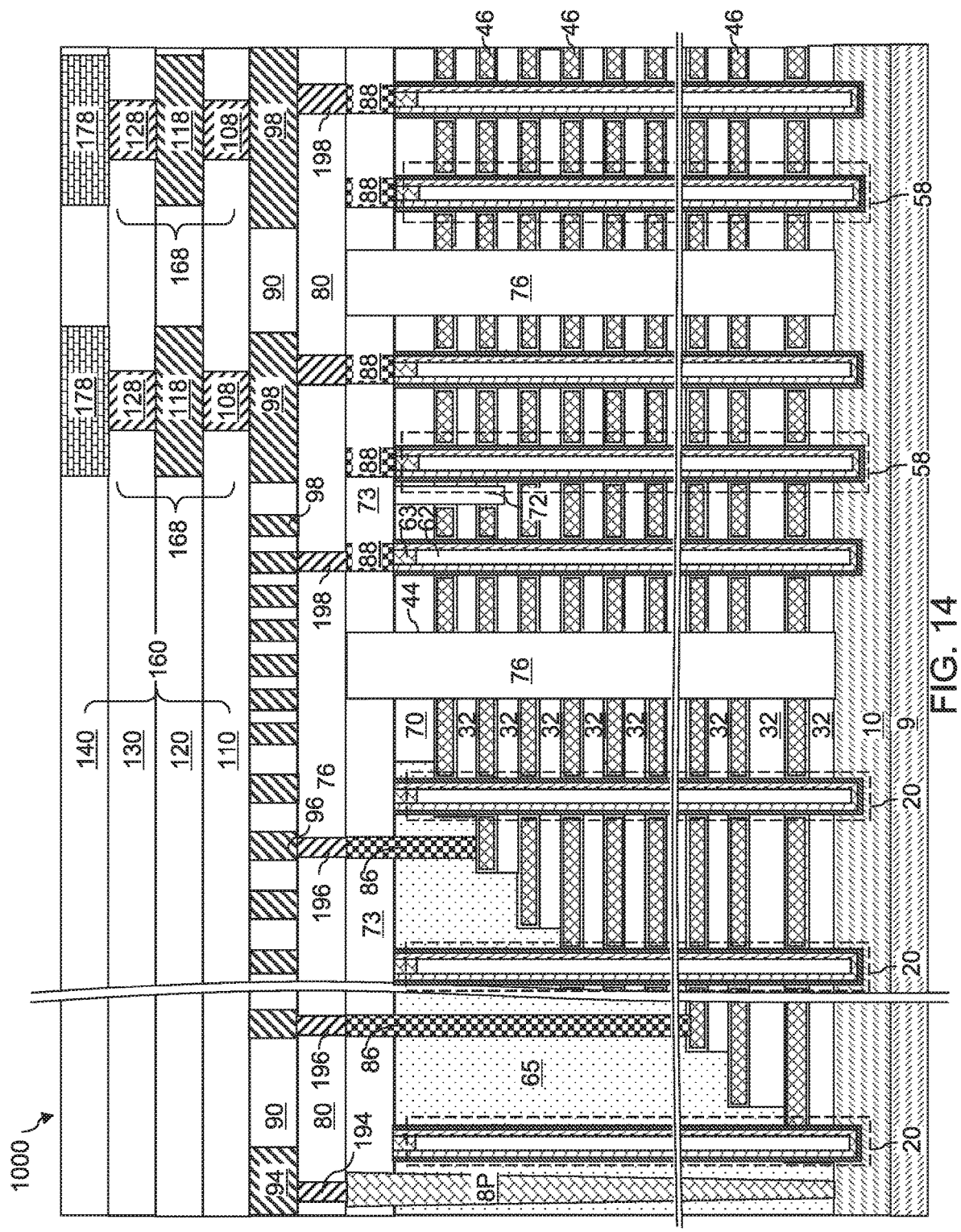
FIG. 14 is a schematic vertical cross-sectional view of the exemplary structure that forms a first semiconductor die after formation of additional metal interconnect structures according to an embodiment of the present disclosure.

Referring to FIG. 14, a memory die 1000 is provided by performing additional processing steps on the exemplary structure of FIGS. 13A and 13B. Specifically, additional metal interconnect structures 168 included in additional interconnect level dielectric layers 160 are formed. In an illustrative example, the additional interconnect level dielectric layers 160 can include a via level dielectric layer 110, a second line level dielectric layer 120, a second via level dielectric layer 130, and a metallic pad structure level dielectric layer 140. The metal interconnect structures 168 can include first metal via structures 108 included in the first via level dielectric layer 110, second metal line structures 118 included within the second line level dielectric layer 120, second metal via structures 128 included in the second via level dielectric layer 130, and first bonding structures 178 (such as metallic pad structures) included in the metallic pad structure level dielectric layer 140. While the present disclosure is described using an example in which the additional interconnect level dielectric layers 160 include the first via level dielectric layer 110, the second line level dielectric layer 120, the second via level dielectric layer 130, and the metallic pad structure level dielectric layer 140, embodiments are expressly contemplated herein in which the additional interconnect level dielectric layers 160 include a different number and/or different combinations of dielectric material layers. The memory die 1000 includes a three-dimensional array of memory elements. Electrical connection paths can be provided by each combination of a first bonding structure 178 and a set of metal interconnect structures {(194, 94, 108, 118, 128), (196, 96, 108, 118, 128), or (198, 98, 108, 118, 128)}.

Figure 15:
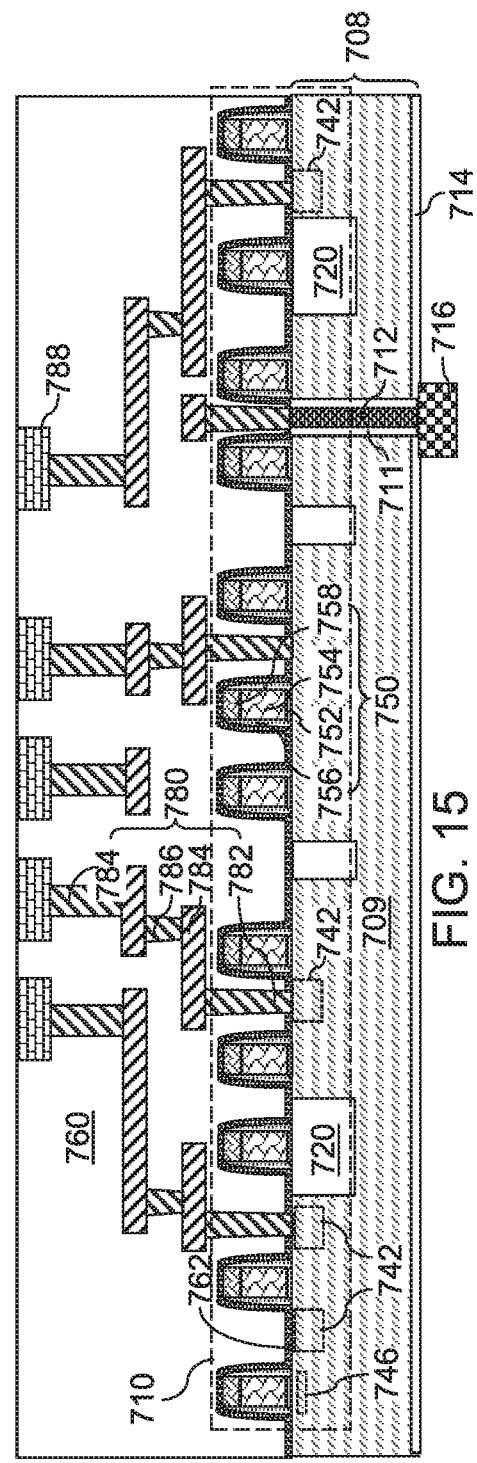
FIG. 15 is a schematic vertical cross-sectional view of a second semiconductor die according to an embodiment of the present disclosure.

Referring to FIG. 15, a second semiconductor die can be provided, which can be a logic die 700 including various semiconductor devices 710. The semiconductor devices 710 includes a peripheral circuitry for operation of the three-dimensional memory arrays in the memory die 1000. The peripheral circuitry can include a word line driver that drives the electrically conductive layers 46 within the memory die 1000, a bit line driver that drives the bit lines 98 in the memory die 1000, a word line decoder circuitry that decodes the addresses for the electrically conductive layers 46, a bit line decoder circuitry that decodes the addresses for the bit lines 98, a sense amplifier circuitry that senses the states of memory elements within the memory stack structures 55 in the memory die 1000, a power supply/distribution circuitry that provides power to the memory die 1000, a data buffer and/or latch, and/or any other semiconductor circuitry that can be used to operate the array of memory stack structures 58 in the memory die 1000. The logic die 700 can include a logic-die substrate 708, which can be a semiconductor substrate. The logic-die substrate can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 can be formed in an upper portion of the substrate semiconductor layer 709 to provide electrical isolation for semiconductor devices of the sense amplifier circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 1000 comprising the electrically conductive layers 46.

Dielectric material layers are formed over the semiconductor devices 710, which are herein referred to as logic-side dielectric layers 760. Optionally, a dielectric liner 762 (such as a silicon nitride liner) can be formed to apply mechanical stress to the various field effect transistors and/or to prevent diffusion of hydrogen or impurities from the logic-side dielectric layers 760 into the semiconductor devices 710. Logic-side metal interconnect structures 780 are included within the logic-side dielectric layers 760. The logic-side metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and second bonding structures 788 (such as metallic pad structures) that may be configured to function as bonding pads.

The logic die 700 can include a backside insulating layer 714 located on the backside surface of the logic die substrate 708. Laterally-insulated through-substrate via structures (711, 712) can be formed through the logic die substrate 708 to provide electrical contact to various input nodes and output nodes of the periphery circuitry. Each laterally-insulated through-substrate via structure (711, 712) includes a through-substrate conductive via structure 712 and a tubular insulating liner 711 that laterally surrounds the through-substrate conductive via structure 712. Backside bonding pads 716 can be formed on surface portions of the laterally-insulated through-substrate via structures (711, 712). Generally, a semiconductor die is provided, which includes semiconductor devices 710 located on a semiconductor substrate (such as the substrate semiconductor layer 709). The second bonding structures 788 overlie, and are electrically connected to, the semiconductor devices 710, and laterally-insulated through-substrate via structures (711, 712) can extend through the semiconductor substrate.

Figure 16:
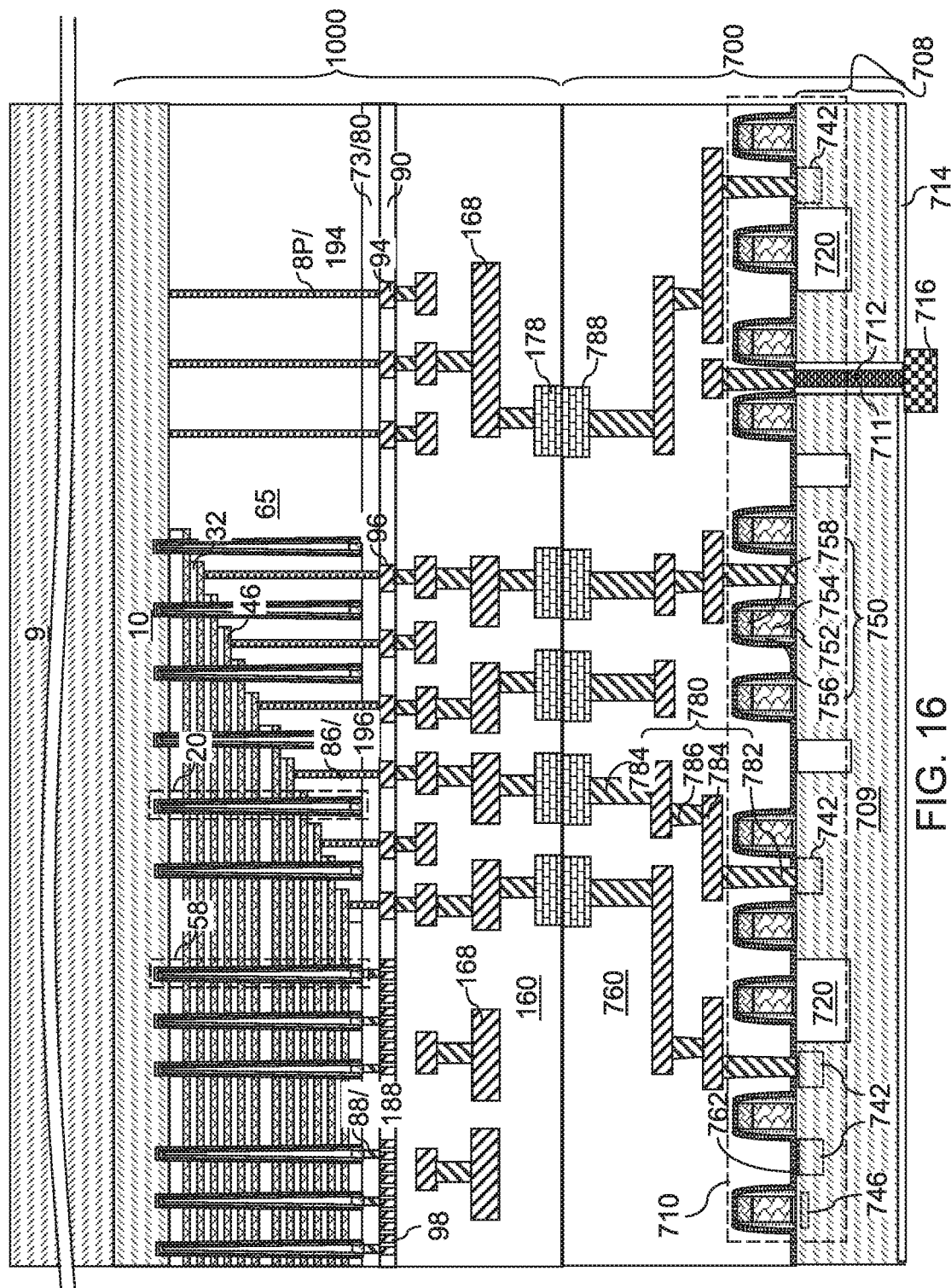
FIG. 16 is a schematic vertical cross-sectional view of a bonded assembly of the first semiconductor die and the second semiconductor die according to an embodiment of the present disclosure.

Referring to FIG. 16, the memory die 1000 and the logic die 700 are positioned such that the second bonding structures 788 of the logic die 700 face the first bonding structures 178 of the memory die 1000. In one embodiment, the memory die 1000 and the logic die 700 can be designed such that the pattern of the second bonding structures 788 of the logic die 700 is the mirror pattern of the pattern of the first bonding structures 178 of the memory die 1000. The memory die 1000 and the logic die 700 can be bonded to each other by metal-to-metal bonding. Alternatively, an array of solder material portions may be used to bond the memory die 1000 and the logic die 700 through the array of solder material portions (such as solder balls).

In the case of metal-to-metal bonding, facing pairs of a first bonding structure 178 of the memory die 1000 and a second bonding structure 788 of the logic die 700 can brought to direct contact with each other, and can be subjected to an elevated temperature to induce material diffusion across the interfaces between adjoined pairs of metallic pad structures (178, 788). The interdiffusion of the metallic material can induce bonding between each adjoined pairs of metallic pad structures (178, 788). In addition, the logic-side dielectric layers 760 and the interconnect level dielectric layers 160 can include a dielectric material (such as a silicate glass material) that can be bonded to each other. In this case, physically exposed surfaces of the logic-side dielectric layers 760 and the interconnect level dielectric layers 160 can be brought to direct contact with each other and can be subjected to thermal annealing to provide additional bonding.

In case an array of solder material portions is used to provide bonding between the memory die 1000 and the logic die 700, a solder material portion (such as a solder ball) can be applied to each of the first bonding structures 178 of the memory die 1000, and/or to each of the second bonding structures 788 of the logic die 700. The memory die 1000 and the logic die 700 can be bonded to each other through an array of solder material portions by reflowing the solder material portions while each solder material portion is contacted by a respective pair of a first bonding structure 178 of the memory die 1000 and a second bonding structure 788 of the logic die 700.

Generally, a logic die 700 can be bonded to a memory die 1000. The memory die 1000 comprises an array of memory stack structures 55, and the logic die 1000 comprises a complementary metal oxide semiconductor (CMOS) circuit that includes a peripheral circuitry electrically coupled to nodes of the array of memory stack structures 55 through a subset of metal interconnect structures 168 included within the memory die 1000. The memory die 1000 includes the semiconductor material layer 10, and is attached to the carrier substrate 9.

Figure 17:
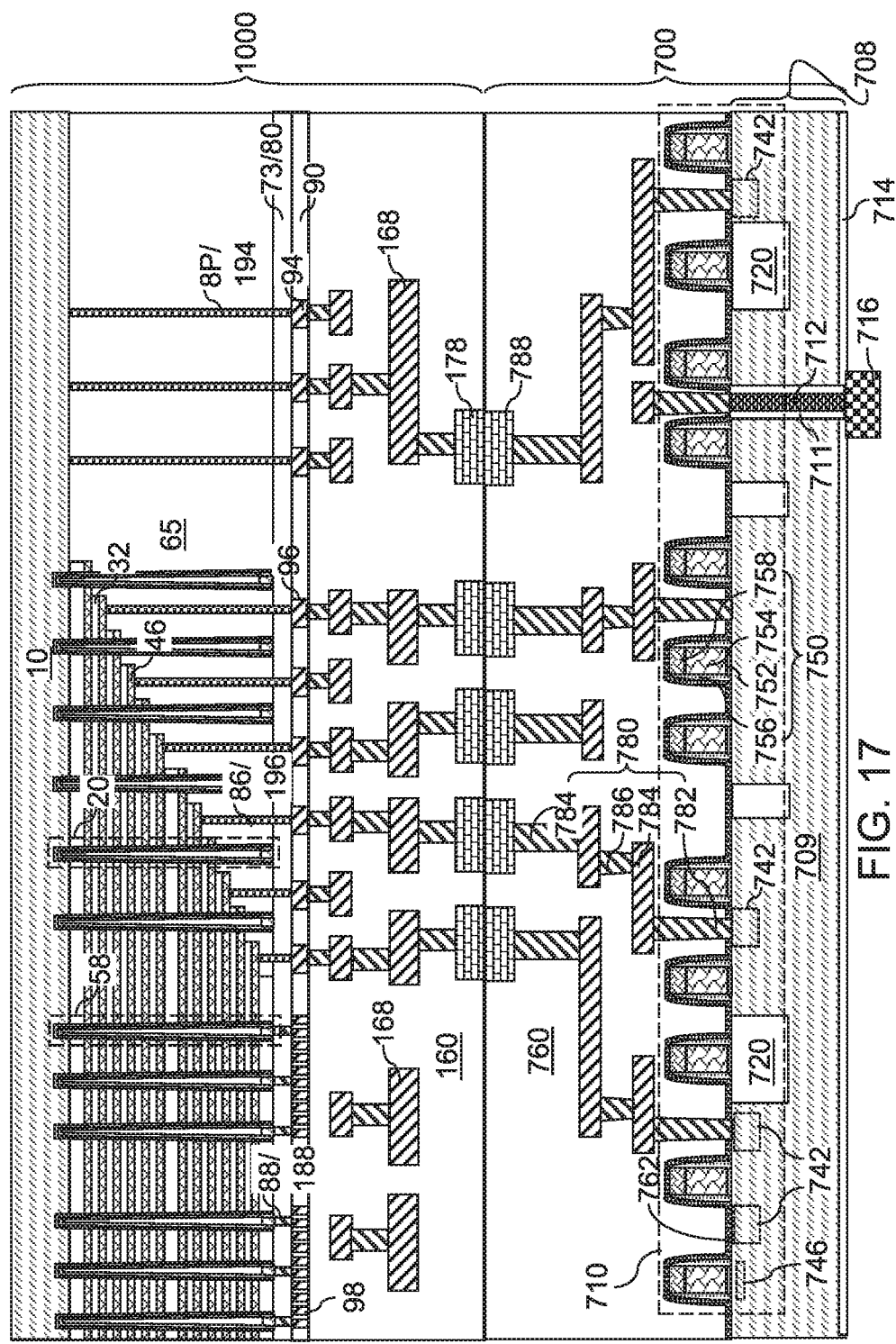
FIG. 17 is a schematic vertical cross-sectional view of the bonded assembly after removal of a distal portion of the carrier substrate according to an embodiment of the present disclosure.

Referring to FIG. 17, the carrier substrate 9 can be removed from above the semiconductor material layer 10. For example, a backside grinding process can be performed to remove the carrier substrate 9 in case the carrier substrate 9 includes a bulk portion of a semiconductor wafer. In case the carrier substrate 9 includes a different material than the semiconductor material layer 10, a suitable separation method may be used to detach the carrier substrate 9 from the semiconductor material layer 10. In one embodiment, the carrier substrate 9 may be attached to the semiconductor material layer 10 through a sacrificial separation material layer that is isotropically etched (for example, in a wet etch process) to induce separation of the carrier substrate 9 from the semiconductor material layer 10. In one embodiment, the sacrificial separation material layer can include silicon nitride, and removal of the sacrificial separation material layer can be performed by a wet etch process using hot phosphoric acid. A backside surface of the semiconductor material layer 10 can be physically exposed upon removal of the carrier substrate 9.

Figure 18:
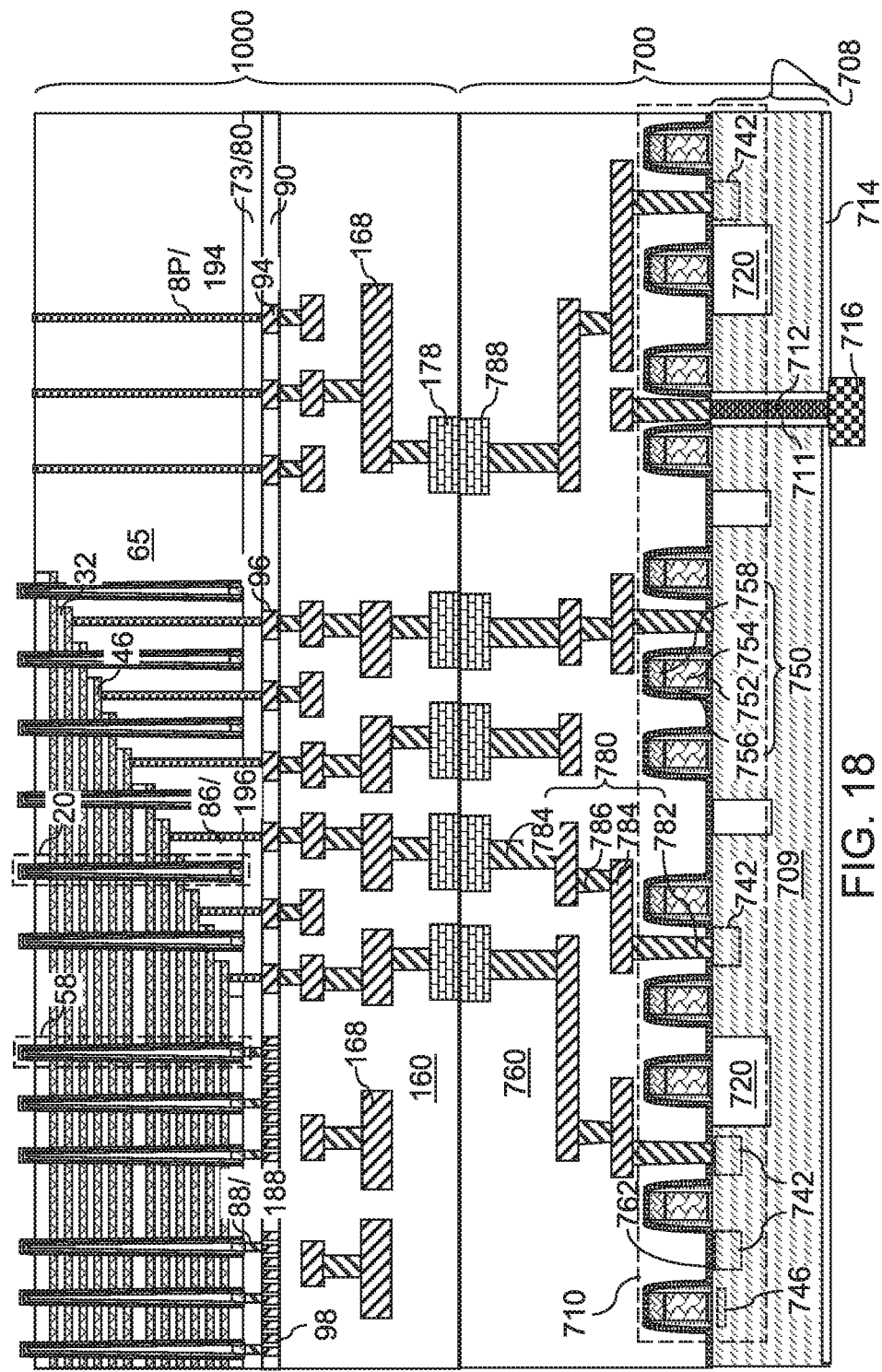
FIG. 18 is a schematic vertical cross-sectional view of the bonded assembly after removal of a proximal portion of the carrier substrate according to an embodiment of the present disclosure.

Referring to FIGS. 18 and 19A, the semiconductor material layer 10 can be removed. In one embodiment, removal of the semiconductor material layer 10 may be performed by chemical mechanical planarization (CMP) using the most distal one of the insulating layers 32 and the stepped dielectric material portion 65 as stopping structures. A distal end of each of the vertical semiconductor channels 60 is physically exposed upon removal of the semiconductor material layer 10. A planar surface of a most distal one of the insulating layers 32 (i.e., the bottommost insulating layer 32 formed directly on the semiconductor material layer 10 at the processing steps of FIG. 2) within the alternating stack (32, 46) is physically exposed upon removal of the semiconductor material layer 10. A planar surface of the stepped dielectric material portion 65 is physically exposed upon removal of the semiconductor material layer 10. Portions of the memory stack structures 58 that protrude through a horizontal plane HP including the planar surface of the most distal one of the insulating layers 32 are removed during the CMP process.

Referring to FIG. 19B, physically exposed surfaces of the dielectric cores 62 can be vertically recessed selective to the semiconductor material of the vertical semiconductor channels 60. An isotropic etch process that etches the material of the dielectric cores 62 selective to the semiconductor material of the vertical semiconductor channels 60 can be performed to vertically recess the dielectric cores 62. For example, a wet etch using dilute hydrofluoric acid can be used to vertically recess the distal planar surfaces of the dielectric cores 62 selective to the annular distal surfaces of the vertical semiconductor channels 60 that are located within the horizontal plane HP that includes the annular distal surfaces of the vertical semiconductor channels 60. Vertical recessing of the dielectric cores 62 increases the area of the physically exposed surfaces of the vertical semiconductor channels 60, thereby lowering contact resistance between the vertical semiconductor channels 60 and a source layer to be subsequently formed thereupon. In one embodiment, the dielectric cores 62 can include a dielectric material having a greater etch rate than the dielectric material of the insulating layers 32. For example, the dielectric cores 62 can include borosilicate glass, borophosphosilicate glass, or organosilicate glass, and the insulating layers 32 can include densified undoped silicate glass. In one embodiment, the physically exposed surface of the insulating layer 32 (which is most distal from the interface between the memory die 1000 and the logic die 700, and is most proximal to a source layer to be subsequently formed) may be collaterally recessed during recessing of the physically exposed planar surfaces of the dielectric cores 62. Distal surfaces of the pass-through via structures 8P can be physically exposed.

Figure 20:
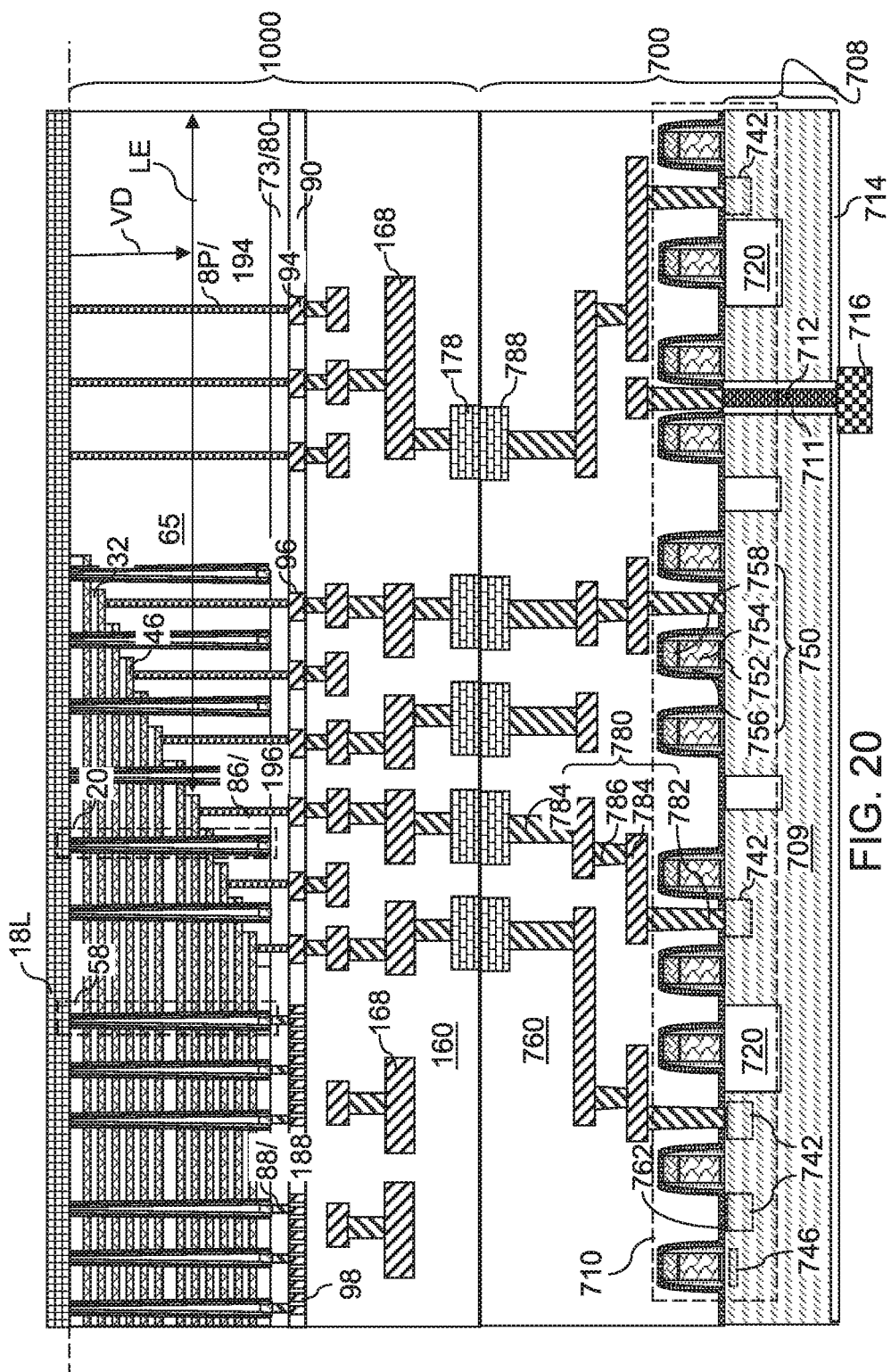
FIG. 20 is a vertical cross-sectional view of the bonded assembly after deposition of a doped semiconductor material layer according to an embodiment of the present disclosure.

Referring to FIGS. 19C and 20, a doped semiconductor material layer 18L can be deposited directly on the physically exposed surfaces of the vertical semiconductor channels 60, the planar surface of the physically exposed one of the insulating layers 32, and on the physically exposed planar surface of the stepped dielectric material portion 65. The doped semiconductor material layer 18L can include a conductive semiconductor material (i.e., a heavily doped semiconductor material) having a doping of the second conductivity type, i.e., the opposite of the first conductivity type. Thus, the doped semiconductor material layer 18L can include a doped semiconductor material having a conductivity greater than $1.0 \times 10^5$ S/cm. The thickness of the doped semiconductor material layer 18L can be in a range from 100 nm to 1,000 nm, although lesser and greater thicknesses can also be used. Vertically protruding portions 18P of the doped semiconductor material layer 18L vertically protrude across the horizontal plane including the annular top surfaces of the vertical semiconductor channels 60 toward a respective one of the dielectric cores 62, and contacts the respective one of the dielectric cores 62.

Figure 21:
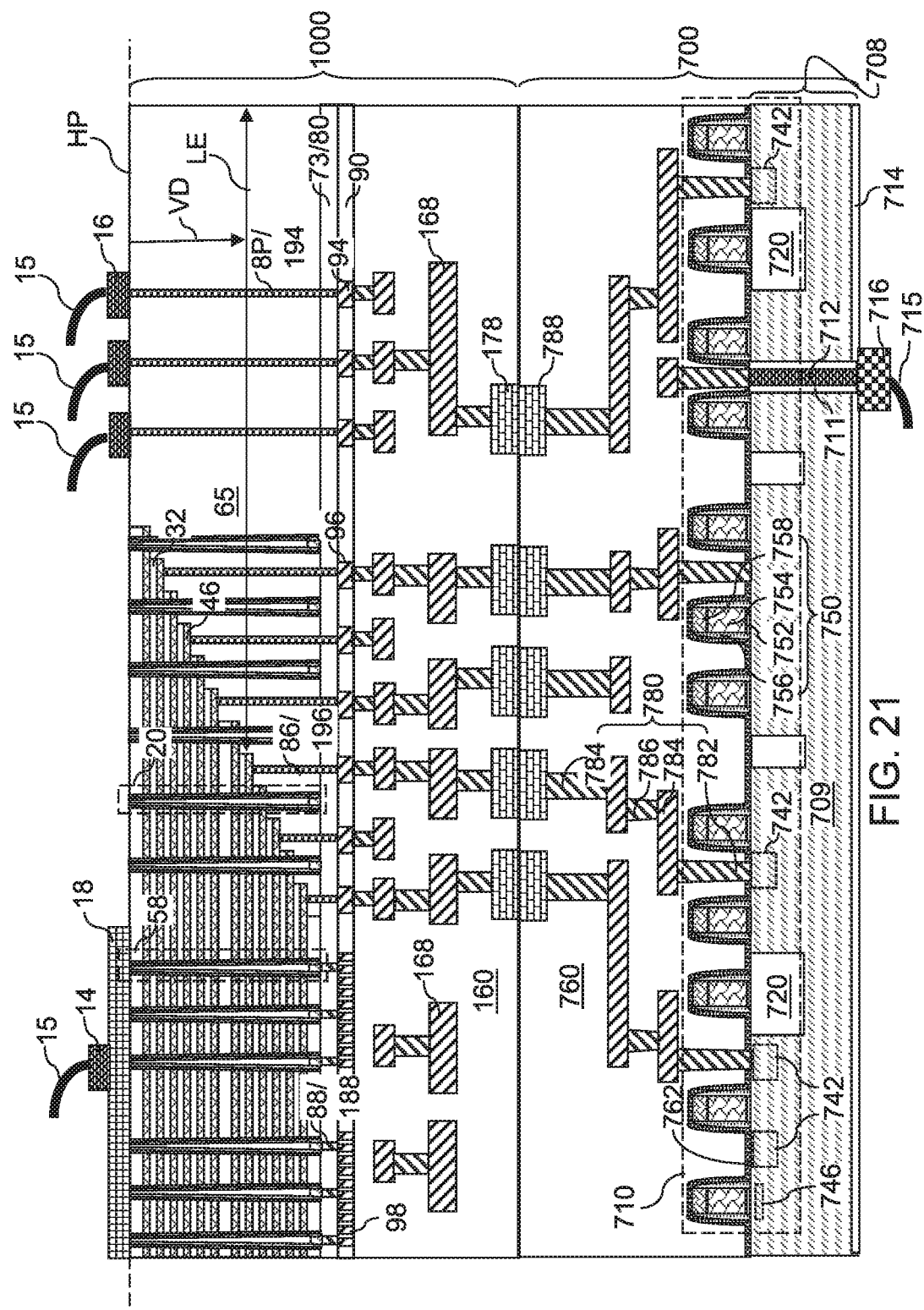
FIG. 21 is a vertical cross-sectional view of the bonded assembly after patterning the doped semiconductor material layer into a source layer and after formation of various bonding pads and attachment of bonding wires according to an embodiment of the present disclosure.

Referring to FIG. 21, the doped semiconductor material layer 18L can be patterned into a source layer 18, for example, by a combination of lithographic methods and an etch process. A lithographically patterned photoresist layer can cover only the portion of the doped semiconductor material layer 18L located within the memory array region.

An etch process can be used to remove portions of the doped semiconductor material layer 18L that are not covered by the patterned photoresist layer. The photoresist layer can be removed, for example, by ashing. The source layer 18 is formed directly on the distal end of each of the vertical semiconductor channels 60 within the memory opening fill structures 58, and does not contact any of the vertical semiconductor channels 60 within the support pillar structures 20. The lateral extent of the source layer 18 can be confined within the areas of the memory regions 100. The source layer 18 includes a doped semiconductor material having a conductivity greater than $1.0 \times 10^5$ S/cm. Optionally, a dielectric passivation layer (not shown) may be formed over the alternating stack (32, 46), the stepped dielectric material portion 65, and the source layer 18.

Various bonding pads (14, 16) can be formed on the source layer 18 and the pass-through via structures 8P. The bonding pads (14, 16) can include at least one source bonding pad 14 formed directly on the back side of the source layer 18, and peripheral device bonding pads 16 formed directly on distal surfaces of the pass-through via structures 8P. Bonding wires 15 can be bonded to a respective one of the bonding pads (14, 16). A backside bonding wire 715 can be bonded to each backside bonding pad 716.

Figure 22C:
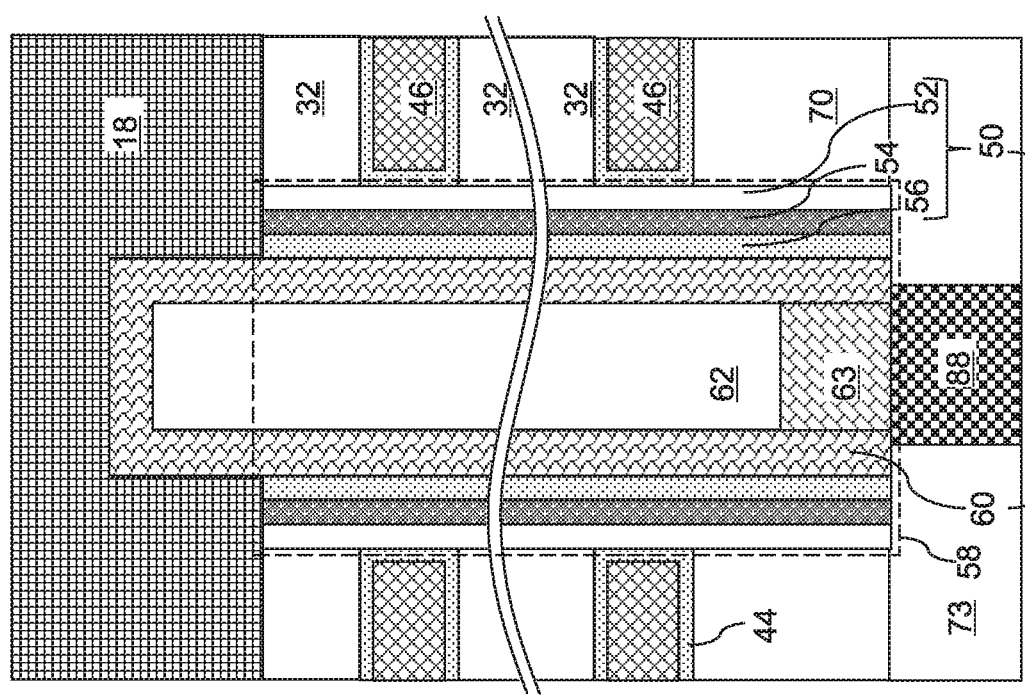

FIGS. 22A-22C illustrate an alternative configuration for a memory opening fill structure during formation of a source layer 18, which may be used in lieu of the processing steps of FIGS. 19A-19C, 20, and 21.

Referring to FIG. 22A, the semiconductor material layer 10 can be removed by a recess etch process, which can include a wet etch process or a dry etch process. In this case, removal of the semiconductor material layer 10 can be selective to the materials of the insulating layers 32, the stepped dielectric material portion 65, and the memory films 50. For example, a wet etch process using KOH or NaOH can be used to remove the semiconductor material layer 10. A distal planar surface of an insulating layer 32 of the alternating stack (32, 46), a planar distal surface of the stepped dielectric material portion 65, and distal outer surfaces of the memory films 50 can be physically exposed upon removal of the semiconductor material layer 10. The memory films 50 can function as etch stop material portions during removal of the semiconductor material layer 10. In one embodiment, the vertical semiconductor channels 60 can be covered by cap portions of the memory films 50 at the distal side of the bonded assembly over the physically exposed surface of the most distal one of the insulating layers 32. The memory films 50 may be substantially intact, or may be partially damaged, for example, by thinning of the outer layer(s) (such as the blocking dielectric layers 52 and/or the charge storage layers 54).

Referring to FIG. 22B, a series of isotropic etch processes can be performed to remove the physically exposed portions of the memory films 50. A surface of a distal portion of each vertical semiconductor channel 60 can be physically exposed after the series of isotropic etch processes. An outer sidewall of each vertical semiconductor channel 60 can vertically protrude outward from the horizontal plane including the physically exposed surface of an insulating layer 32.

Referring to FIG. 22C, the processing steps of FIGS. 19C, 20, and 21 can be performed to form a source layer 18 that contacts outer sidewalls of the vertical semiconductor channels within the memory opening fill structures 58.

Referring to all drawings and referring to various embodiments of the present disclosure, a three-dimensional memory device comprises a memory die 1000 bonded to a logic die 700 is provided. The memory die 1000 comprises: an alternating stack of insulating layers 32 and electrically conductive layers 46; memory stack structures 55 extending through the alternating stack (32, 46), wherein each of the memory stack structures 55 comprises a respective vertical semiconductor channel 60 and a respective memory film 50; drain regions 63 located at a first end (e.g., a proximal end) of a respective one of the vertical semiconductor channels 60; a source layer 18 having a first surface (e.g., the bottom surface facing the vertical semiconductor channels 60 and the logic die 700 shown in FIG. 21) and a second surface (e.g., top surface) opposite to the first surface. The first surface is located at a second end (e.g., a distal end) of each of the vertical semiconductor channels 60. The first end (e.g., proximal end) of each of the vertical semiconductor channels 60 is closer to the logic die 700 than the second end (e.g., distal end) of each of the vertical semiconductor channels 60. A semiconductor wafer 9, such as silicon wafer is not located over the second surface (e.g., top surface in FIG. 21) of the source layer 18. In other words, carrier substrate 9 (e.g., silicon wafer or any other type of substrate) on which the vertical semiconductor channels 60 were originally grown is not present over the source layer 18.

In one embodiment, the source layer 18 and the drain regions 63 comprise a respective doped semiconductor material having a conductivity greater than $1.0 \times 10^5$ S/cm and having a doping of a same conductivity type (such as the second conductivity type, e.g., n-type).

In one embodiment, the first surface of the source layer 18 contacts a planar surface of a most proximal one of the insulating layers 32 (i.e., the most distal insulating layer 32 from the interface between the memory die 1000 and the logic die 700) within the alternating stack (32, 46).

In one embodiment, the alternating stack (32, 46) comprises stepped surfaces that continuously extend from the most proximal one of the insulating layers 32 within the alternating stack to a most distal one of the insulating layers 32 that is most distal from the source layer 18 of all insulating layers of the alternating stack (32, 46); and the memory die 1000 comprises a stepped dielectric material portion 65 contacting the stepped surfaces and having a stepwise-increasing lateral extent LE (shown in FIG. 21) that increases with a vertical distance VD from a horizontal plane HP including an interface between the source layer 18 and the most proximal one of the insulating layers 32.

In one embodiment, the memory die 1000 comprises support pillar structures 20 that vertically extend through a region of the alternating stack (32, 46) that underlie or overlie the stepped surfaces and a region of the stepped dielectric material portion 65 that overlie or underlie the stepped surfaces; and each of the support pillar structures 20 comprises a first semiconductor material portion (i.e., the vertical semiconductor channels 60 within the support pillar structure 20) having a same composition as the vertical semiconductor channels 60 (of the memory opening fill structures 58), a second semiconductor material portion (i.e., the drain regions 63 within the support pillar structure 20) having a same composition as the drain regions 63 (of the memory opening fill structures 58), and a dielectric layer stack (i.e., the memory film 50 within the support pillar structures 20) containing a same set of dielectric material layers as each of the memory films 50 (within the memory opening fill structures 58).

In one embodiment, each of the memory stack structures 55 and the support pillar structures 20 includes a respective horizontal surface that is located entirely within the horizontal plane including a horizontal interface between the source layer 18 and the vertical semiconductor channels 60; and the memory stack structures and the support pillar structures do not extend through the horizontal plane including the horizontal interface between the source layer and the vertical semiconductor channels 60.

In one embodiment, the source layer 18 does not contact any of the support pillar structures 20; and the source layer 18 comprises vertically protruding portions 18P that protrude through the horizontal plane including the horizontal interface between the source layer 18 and the vertical semiconductor channels 60, and contacts sidewalls of the vertical semiconductor channels 60.

In one embodiment, the three-dimensional memory device comprises: a bonding pad 14 contacting the second surface of the source layer 18; pass-through via structures 8P that vertically extend through the stepped dielectric material portion 65; and additional bonding pads 16 contacting a respective one of the pass-through via structures 8P.

In one embodiment, a horizontal surface of the stepped dielectric material portion 65 is located within the horizontal plane including the interface between the source layer 18 and the most proximal one of the insulating layers 32, the additional bonding pads 16 contact a respective annular portion of the horizontal surface of the stepped dielectric material portion 65; and the bonding pad 14 that contacts the source layer 18 is vertically offset from the additional bonding pads by a thickness of the source layer 18.

In one embodiment, the three-dimensional memory device comprises: a bonding wire 15 bonded to the boding pad 14 that contacts the source layer 18; and additional bonding wires 15 bonded to a respective one of the additional bonding pads 16.

In one embodiment, the memory die 1000 comprises first bonding structures 178 that are more distal from a horizontal plane including interfaces between the source layer 18 and the vertical semiconductor channels 60 than the drain regions 63 are from the horizontal plane; the logic die 700 contains second bonding structures 788; and the second bonding structures 788 are bonded to the first bonding structures 178.

In one embodiment, the memory die 1000 comprises a two-dimensional array of vertical NAND strings that form a three-dimensional array of memory elements; and the logic die 700 includes a peripheral circuitry that support operation of the three-dimensional array of memory elements.

In one embodiment, the three-dimensional memory device comprises: laterally-insulated through-substrate via structures (711, 712) that vertically extend through a substrate 709 of the logic die 700 and are electrically connected to a respective node of peripheral circuitry semiconductor devices 710 located on the logic die 700; and backside bonding pads 716 contacting a respective one of the laterally-insulated through-substrate via structures (711, 712) and vertically spaced from the semiconductor devices 710 by the substrate 709 of the logic die 700.

The source layer 18 according to various embodiments of the present disclosure provides electrical contact to each distal end of the vertical semiconductor channels 60 without using any replacement of materials through narrow trenches. Further, the source layer 18 can contact inner sidewalls or outer sidewalls of the distal ends of the vertical semiconductor channels 60, thereby providing low contact resistance between the vertical semiconductor channels 60 and the source layer 18. Thus, reduction in process complexity and enhancement of electrical contact between the vertical semiconductor channels 60 and the source layer 18 can be achieved by the methods and structures of various embodiments of the present disclosure.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure comprising:
a memory die bonded to a logic die, the memory die comprising:
an alternating stack of insulating layers and electrically conductive layers;
memory stack structures extending through the alternating stack, wherein each of the memory stack structures comprises a respective vertical semiconductor channel and a respective memory film;
drain regions located at a first end of a respective one of the vertical semiconductor channels; and
a source layer having a first surface and a second surface, wherein the first surface is located at a second end of each of the vertical semiconductor channels,
wherein a semiconductor wafer is not located over the second surface of the source layer.

2. The semiconductor structure of claim 1, wherein the source layer and the drain regions comprise a respective doped semiconductor material having a conductivity greater than $1.0 \times 10^5$ S/cm and having a doping of a same conductivity type.

3. The semiconductor structure of claim 1, wherein the first surface of the source layer contacts a planar surface of a most proximal one of the insulating layers within the alternating stack.

4. The semiconductor structure of claim 3, wherein:
the alternating stack comprises stepped surfaces that continuously extend from the most proximal one of the insulating layers within the alternating stack to a most distal one of the insulating layers that is most distal from the source layer of all insulating layers of the alternating stack; and
the memory die comprises a stepped dielectric material portion contacting the stepped surfaces and having a stepwise-increasing lateral extent that increases with a vertical distance from a horizontal plane including an interface between the source layer and the most proximal one of the insulating layers.

5. The semiconductor structure of claim 4, wherein:
the memory die comprises support pillar structures that vertically extend through a region of the alternating stack that underlie or overlie the stepped surfaces and a region of the stepped dielectric material portion that overlie or underlie the stepped surfaces; and
each of the support pillar structures comprises a first semiconductor material portion having a same composition as the vertical semiconductor channels, a second semiconductor material portion having a same composition as the drain regions, and a dielectric layer stack containing a same set of dielectric material layers as each of the memory films.

6. The semiconductor structure of claim 5, wherein:
each of the memory stack structures and the support pillar structures includes a respective horizontal surface that is located entirely within the horizontal plane including a horizontal interface between the source layer and the vertical semiconductor channels; and
the memory stack structures and the support pillar structures do not extend through the horizontal plane including the horizontal interface between the source layer and the vertical semiconductor channels.

7. The semiconductor structure of claim 5, wherein:
the source layer does not contact any of the support pillar structures; and
the source layer comprises vertically protruding portions that protrude through a horizontal plane including a horizontal interface between the source layer and the vertical semiconductor channels, and contacts sidewalls of the vertical semiconductor channels.

8. The semiconductor structure of claim 4, further comprising:
a bonding pad contacting the second surface of the source layer;
pass-through via structures that vertically extend through the stepped dielectric material portion; and
additional bonding pads contacting a respective one of the pass-through via structures.

9. The semiconductor structure of claim 8, wherein:
a horizontal surface of the stepped dielectric material portion is located within the horizontal plane including the interface between the source layer and the most proximal one of the insulating layers;
the additional bonding pads contact a respective annular portion of the horizontal surface of the stepped dielectric material portion; and
the bonding pad that contacts the source layer is vertically offset from the additional bonding pads by a thickness of the source layer.

10. The semiconductor structure of claim 9, further comprising:
a bonding wire bonded to the boding pad that contacts the source layer; and
additional bonding wires bonded to a respective one of the additional bonding pads.

11. The semiconductor structure of claim 1, wherein:
the memory die comprises first bonding structures that are more distal from a horizontal plane including interfaces between the source layer and the vertical semiconductor channels than the drain regions are from the horizontal plane;
the logic die contains second bonding structures; and
the second bonding structures are bonded to the first bonding structures.

12. The semiconductor structure of claim 11, wherein:
the memory die comprises a two-dimensional array of vertical NAND strings that form a three-dimensional array of memory elements; and
the logic die includes a peripheral circuitry that supports operation of the three-dimensional array of memory elements.

13. The semiconductor structure of claim 11, further comprising:
- laterally-insulated through-substrate via structures that vertically extend through a substrate of the logic die and are electrically connected to a respective node of peripheral circuitry semiconductor devices located on the logic die; and
- backside bonding pads contacting a respective one of the laterally-insulated through-substrate via structures and vertically spaced from the semiconductor devices by the substrate of the logic die.

14. A method of forming a three-dimensional memory device, comprising:
- forming an alternating stack of insulating layers and spacer material layers over a carrier substrate, wherein the spacer material layers are formed as, or are subsequently replaced with, electrically conductive layers;
- forming memory stack structures through the alternating stack, wherein each of the memory stack structures comprises a respective vertical semiconductor channel and a respective memory film;
- removing the carrier substrate; and
- forming a source layer directly on the distal end of each of the vertical semiconductor channels.

15. The method of claim 14, wherein the source layer comprises a doped semiconductor material having a conductivity greater than $1.0 \times 10^5$ S/cm.

16. The method of claim 14, further comprising:
- forming drain regions on the distal ends of the vertical semiconductor channels;
- forming bit lines connected to a respective subset of the drain regions; and
- forming first bonding structures over the bit lines, wherein a subset of the first bonding structures is electrically connected to the bit lines.

17. The method of claim 16, further comprising:
- forming stepped surfaces by patterning the alternating stack, wherein the stepped surfaces continuously extend from a bottommost one of the insulating layers within the alternating stack to a topmost one of the insulating layers of the alternating stack;
- forming a stepped dielectric material portion on the stepped surfaces, wherein the stepped dielectric material portion has a stepwise-increasing lateral extent that increases with a vertical distance from the carrier substrate; and
- forming support pillar structures through a region of the alternating stack that underlie the stepped surfaces and a region of the stepped dielectric material portion that overlie the stepped surfaces, wherein each of the support pillar structures comprises a semiconductor material portion having a same composition as the vertical semiconductor channels, and a dielectric layer stack containing a same set of dielectric material layers as each of the memory films.

18. The method of claim 14, further comprising:
providing a semiconductor die comprising semiconductor devices located on a semiconductor substrate, wherein second bonding structures overlie, and are electrically connected to, the semiconductor devices, and laterally-insulated through-substrate via structures extend through the semiconductor substrate;
bonding the second bonding structures to the first bonding structures;
forming a bonding pad on the source layer; and
forming backside bonding pads on a respective one of the laterally-insulated through-substrate via structures.

19. The method of claim 14, wherein:
physically exposing a planar surface of one of the insulating layers within the alternating stack after removal of the carrier substrate; and
removing portions of the memory stack structures that protrude through a horizontal plane including the planar surface of the one of the insulating layers.

20. The method of claim 19, further comprising:
forming a doped semiconductor material layer on the planar surface of the one of the insulating layers and physically exposed surfaces of the vertical semiconductor channels; and
patterning the doped semiconductor material layer, wherein a remaining portion of the doped semiconductor material layer constitute the source layer.

* * * * *